(12) United States Patent
Ong

(10) Patent No.: US 6,882,171 B2
(45) Date of Patent: Apr. 19, 2005

(54) BONDING PADS FOR TESTING OF A SEMICONDUCTOR DEVICE

(75) Inventor: Adrian E. Ong, Pleasanton, CA (US)

(73) Assignee: Inapac Technology, Inc., San Jose, CA (US)

( * ) Notice: Subject to any disclaimer, the term of this patent is extended or adjusted under 35 U.S.C. 154(b) by 0 days.

(21) Appl. No.: 10/608,613

(22) Filed: Jun. 27, 2003

(65) Prior Publication Data

US 2004/0100296 A1 May 27, 2004

Related U.S. Application Data

(63) Continuation-in-part of application No. 10/305,635, filed on Nov. 27, 2002, now Pat. No. 6,812,726.

(51) Int. Cl.[7] .............................................. G01R 31/26
(52) U.S. Cl. ..................... 324/765; 324/158.1; 365/201
(58) Field of Search ................................ 324/763–765, 324/158.1, 73.1; 714/718, 726; 365/189.01, 189.02, 189.03, 189.04, 189.05, 189.06, 201, 230.08

(56) References Cited

U.S. PATENT DOCUMENTS

| | | | | |
|---|---|---|---|---|
| 4,825,414 A | * | 4/1989 | Kawata ................. | 365/189.05 |
| 4,873,669 A | * | 10/1989 | Furutani et al. ....... | 365/189.01 |
| 5,326,428 A | | 7/1994 | Farnworth et al. | |
| 5,457,400 A | | 10/1995 | Ahmad et al. | |
| 5,479,105 A | | 12/1995 | Kim et al. | |
| 5,523,697 A | | 6/1996 | Farnworth et al. | |
| 5,535,165 A | * | 7/1996 | Davis et al. ................. | 365/201 |
| 5,594,694 A | * | 1/1997 | Roohparvar et al. ........ | 365/201 |
| 5,619,461 A | | 4/1997 | Roohparvar | |
| 5,657,284 A | | 8/1997 | Beffa | |
| 5,677,885 A | | 10/1997 | Roohparvar | |
| 5,751,015 A | | 5/1998 | Corbett et al. | |
| 5,751,987 A | | 5/1998 | Mahant-Shetti et al. | |
| 5,801,452 A | | 9/1998 | Farnworth et al. | |
| 5,805,609 A | | 9/1998 | Mote, Jr. | |
| 5,807,762 A | | 9/1998 | Akram et al. | |
| 5,825,697 A | | 10/1998 | Gilliam et al. | |
| 5,825,782 A | | 10/1998 | Roohparvar | |
| 5,923,600 A | | 7/1999 | Momohara | |
| 5,925,142 A | | 7/1999 | Raad et al. | |
| 5,936,260 A | | 8/1999 | Corbett et al. | |
| 5,959,310 A | | 9/1999 | Akram et al. | |
| 5,966,388 A | | 10/1999 | Wright et al. | |
| 6,026,039 A | | 2/2000 | Kim et al. | |
| 6,072,326 A | | 6/2000 | Akram et al. | |
| 6,087,676 A | | 7/2000 | Akram et al. | |
| 6,104,658 A | | 8/2000 | Lu | |

(Continued)

Primary Examiner—Minh N. Tang
(74) Attorney, Agent, or Firm—Sidley Austin Brown & Wood LLP

(57) ABSTRACT

A first integrated circuit chip is provided for packaging along with at least a second integrated circuit chip in a semiconductor device, wherein at least some external terminals for the semiconductor device are to be shared by the first and the second integrated circuit chips, wherein the first integrated circuit chip is designed for normal operation and a test mode. The first integrated circuit chip includes up to eleven bonding pads for complete testing of the first integrated circuit chip, wherein the up to eleven bonding pads are for communicating TEST, SET, LOAD, and up to eight TDQ signals. The TEST, SET, and LOAD signals are operable to transition the first integrated circuit chip from normal operation into the test mode and to enable test codes to be loaded into the first integrated circuit chip during a programming phase of the test mode. The up to eight TDQ signals are operable to load test codes into the first integrated circuit during the programming phase of the test mode and to read/write data to and from the first integrated circuit chip during an access phase of the test mode.

28 Claims, 17 Drawing Sheets

U.S. PATENT DOCUMENTS

| | | | |
|---|---|---|---|
| 6,137,167 A | 10/2000 | Ahn et al. |
| 6,154,860 A | 11/2000 | Wright et al. |
| 6,157,046 A | 12/2000 | Corbett et al. |
| 6,188,232 B1 | 2/2001 | Akram et al. |
| 6,194,738 B1 | 2/2001 | Debenham et al. |
| 6,208,157 B1 | 3/2001 | Akram et al. |
| 6,216,241 B1 | 4/2001 | Fenstermaker et al. |
| 6,243,839 B1 | 6/2001 | Roohparvar |
| 6,243,840 B1 | 6/2001 | Raad et al. |
| 6,274,937 B1 | 8/2001 | Ahn et al. |
| 6,286,115 B1 | 9/2001 | Stubbs |
| 6,294,839 B1 | 9/2001 | Mess et al. |
| 6,298,001 B1 | 10/2001 | Lee et al. |
| 6,300,782 B1 | 10/2001 | Hembree et al. |
| 6,310,484 B1 | 10/2001 | Akram et al. |
| 6,320,201 B1 | 11/2001 | Corbett et al. |
| RE37,611 E | 3/2002 | Roohparvar |
| 6,365,421 B1 | 4/2002 | Debenham et al. |
| 6,366,487 B1 | 4/2002 | Yeom |
| 6,392,948 B1 | 5/2002 | Lee |
| 6,395,565 B1 | 5/2002 | Akram et al. |
| 6,396,291 B1 | 5/2002 | Akram et al. |
| 6,407,566 B1 | 6/2002 | Brunelle et al. |
| 6,441,479 B1 | 8/2002 | Ahn et al. |
| 6,445,625 B1 | 9/2002 | Abedifard |
| 6,483,760 B1 | 11/2002 | Kang |
| 6,484,279 B1 | 11/2002 | Akram |
| 6,502,215 B1 | 12/2002 | Raad et al. |
| 6,507,885 B1 | 1/2003 | Lakhani et al. |
| 6,519,171 B1 * | 2/2003 | Matsuzaki et al. ............ 365/51 |
| 6,519,725 B1 | 2/2003 | Huisman et al. |
| 6,732,304 B1 * | 5/2004 | Ong ......................... 714/718 |

* cited by examiner

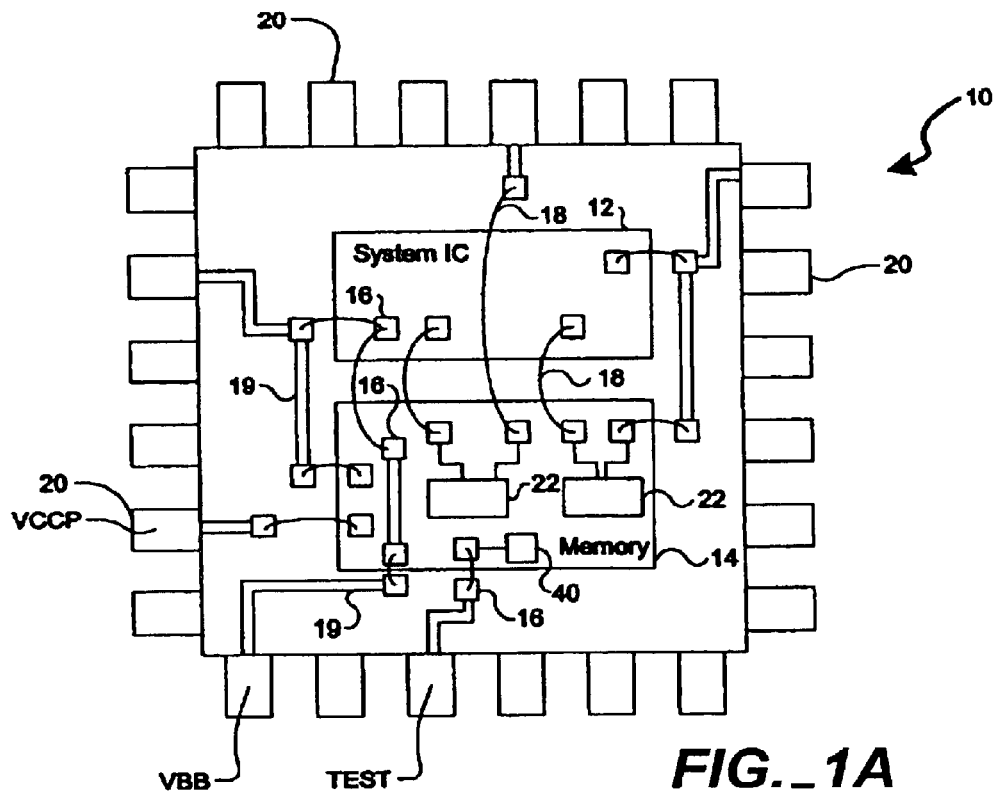
FIG._1A
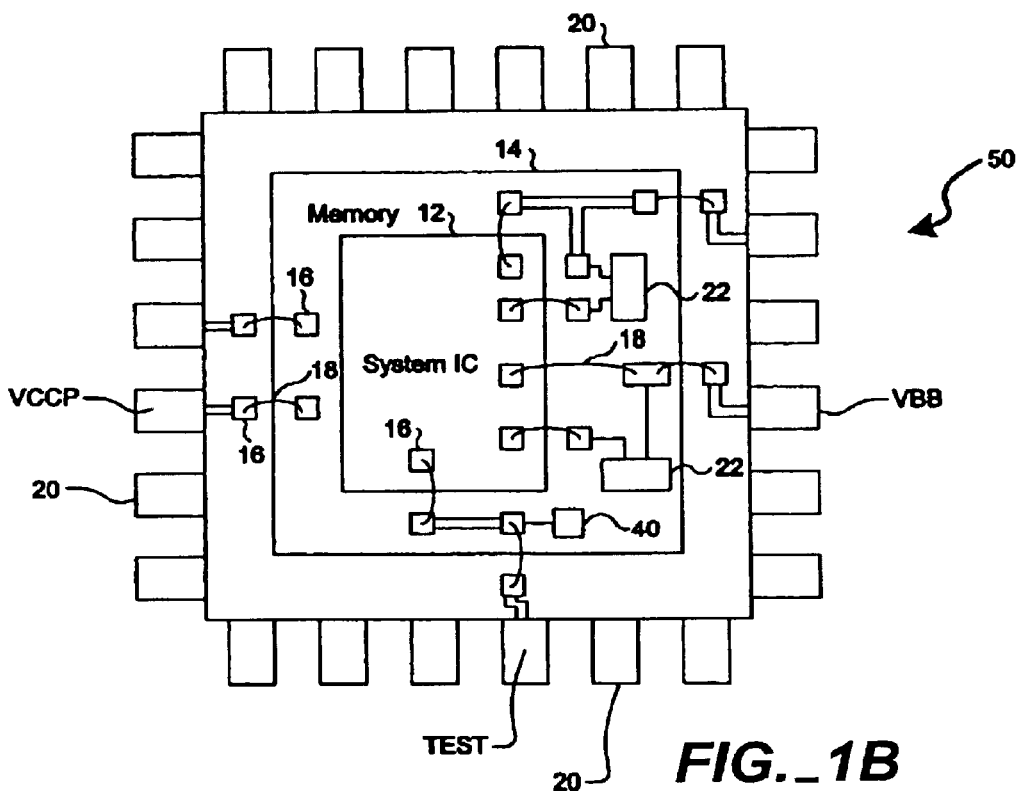
FIG._1B

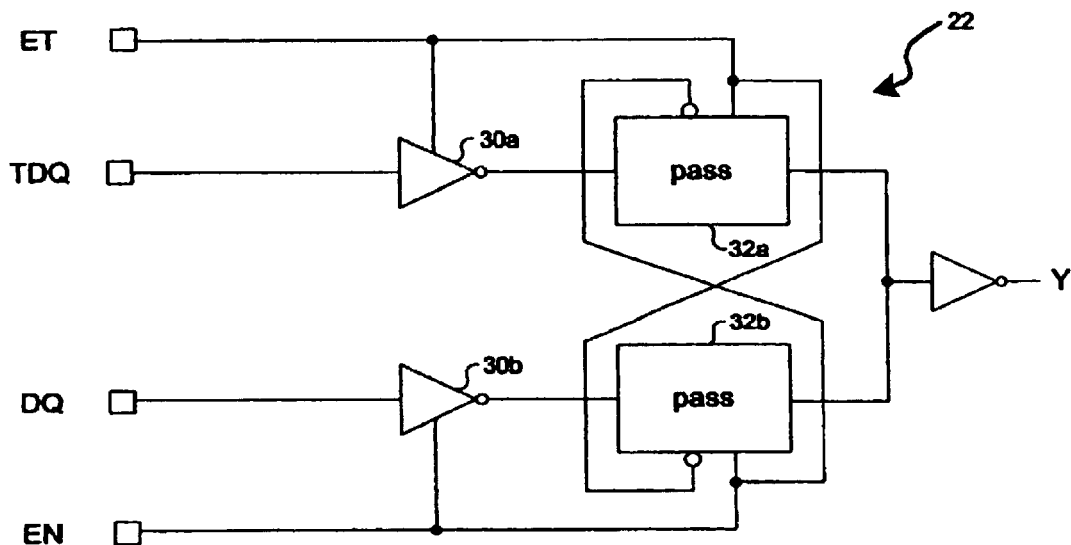
FIG._2A
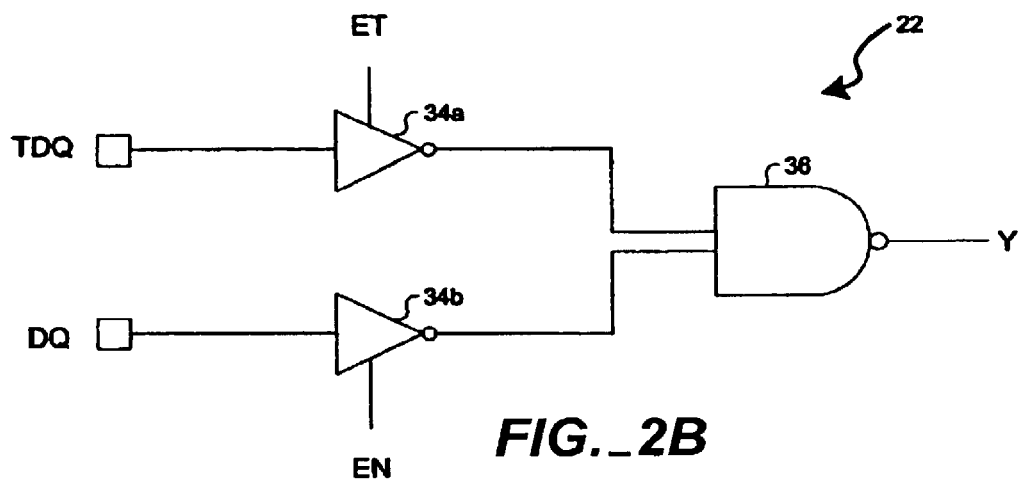
FIG._2B

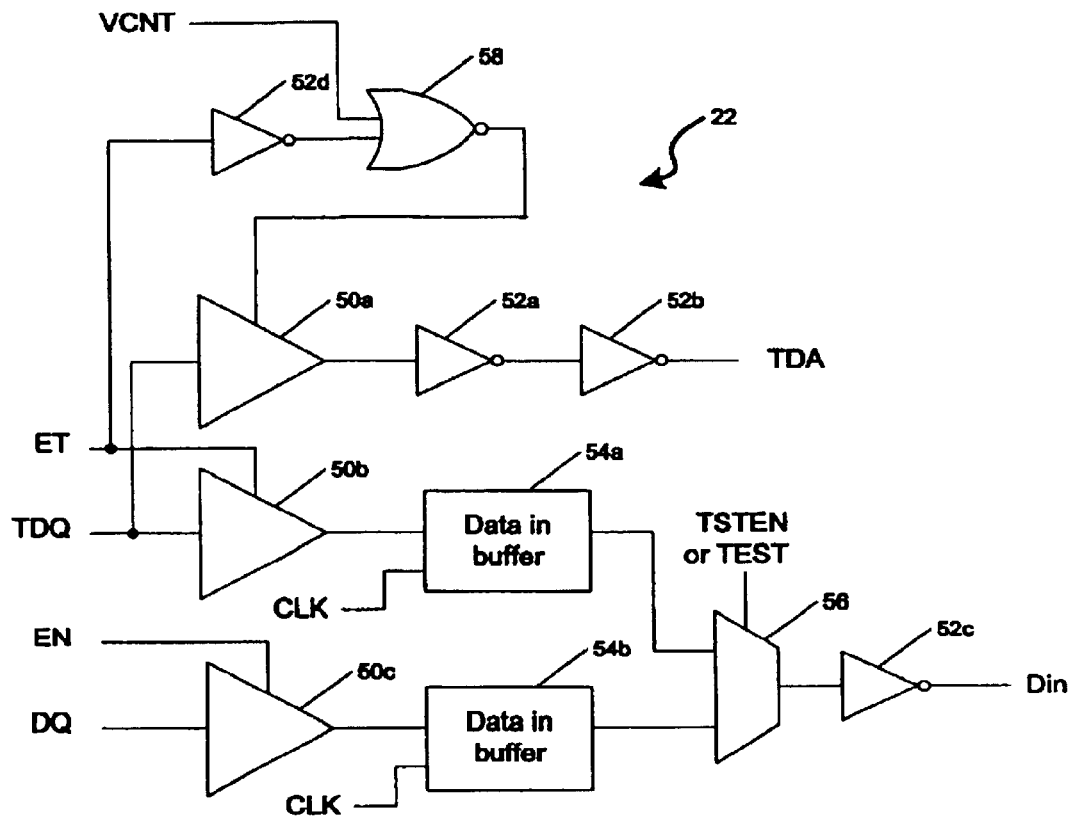
FIG._2C
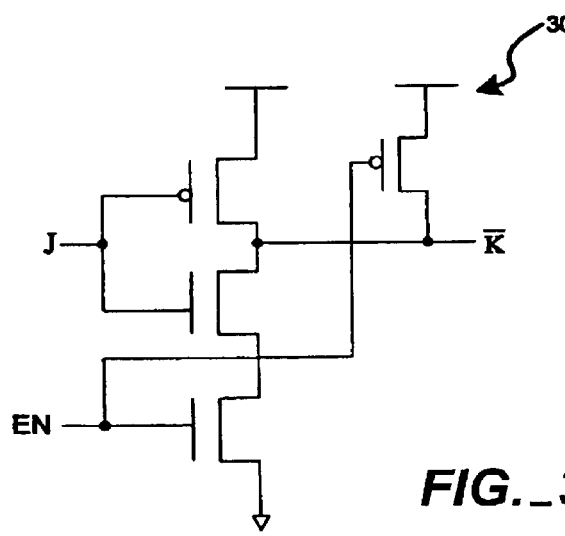
FIG._3

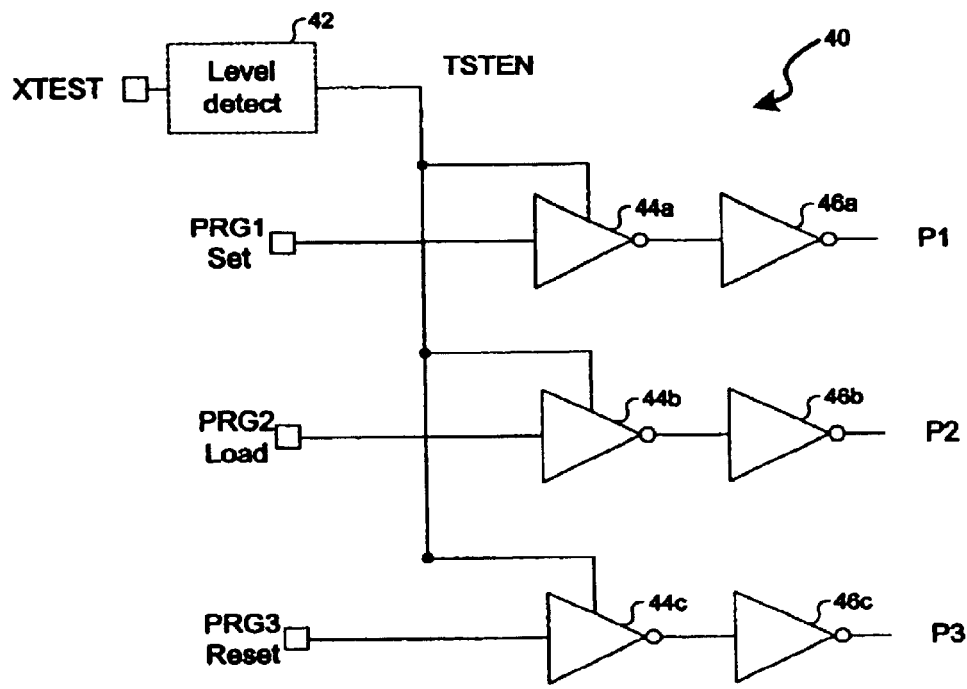
FIG._4
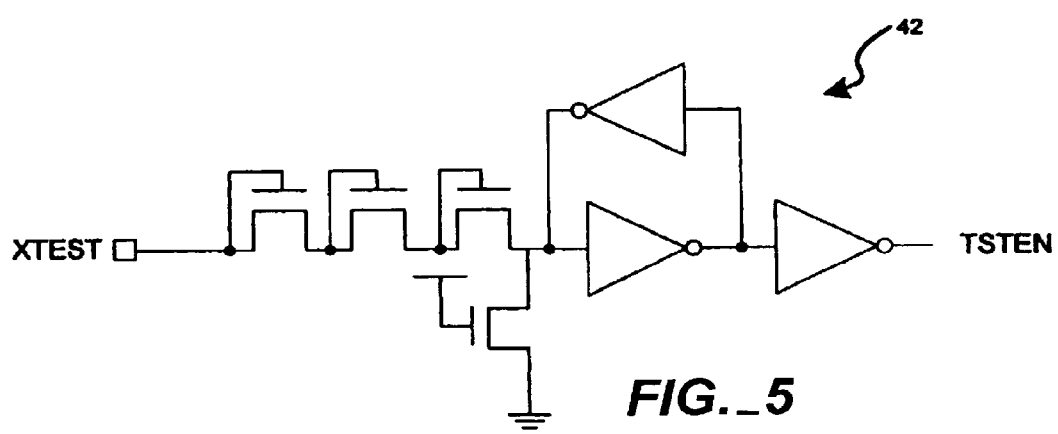
FIG._5

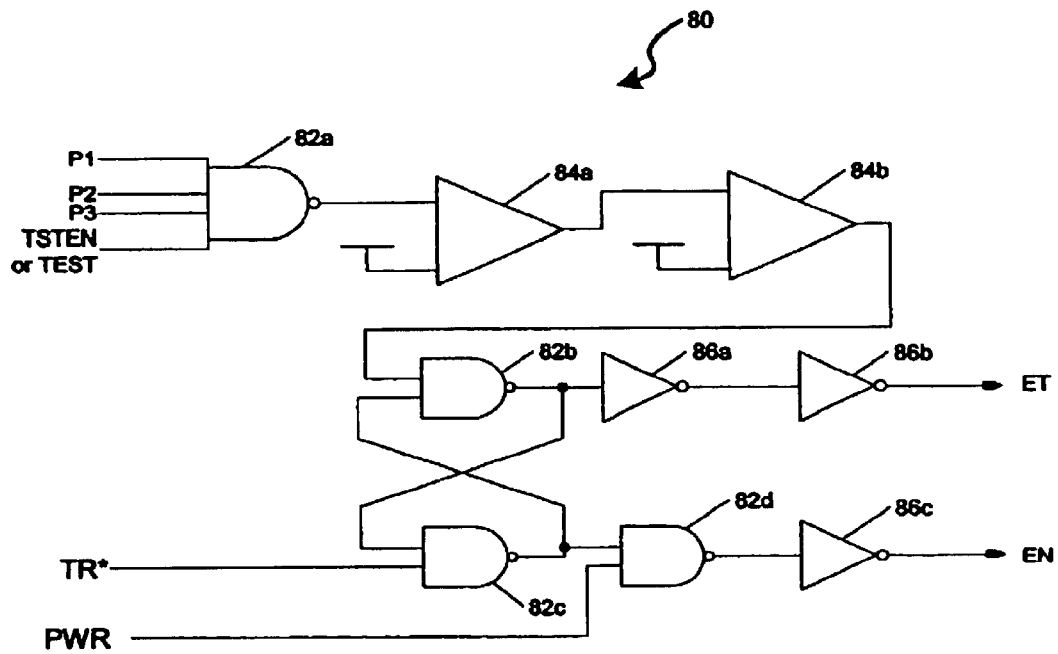
FIG._6
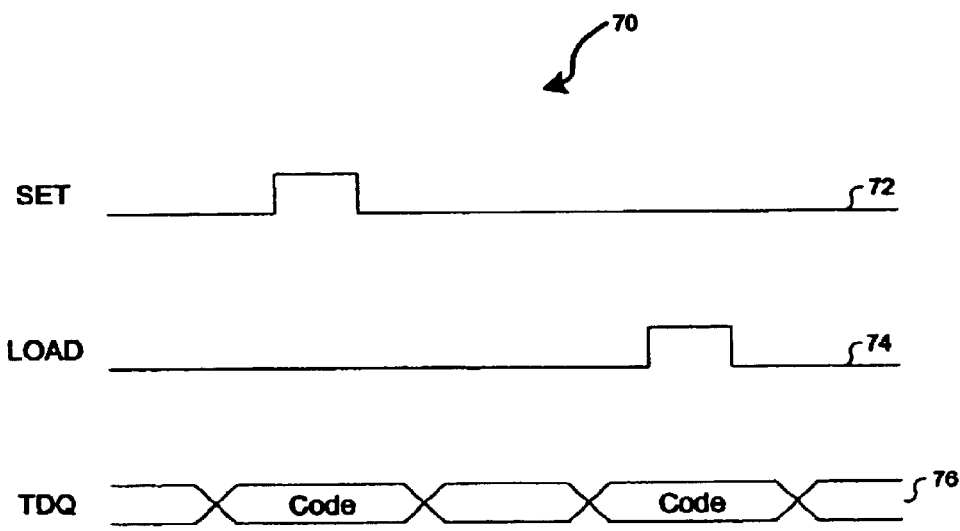
FIG._8

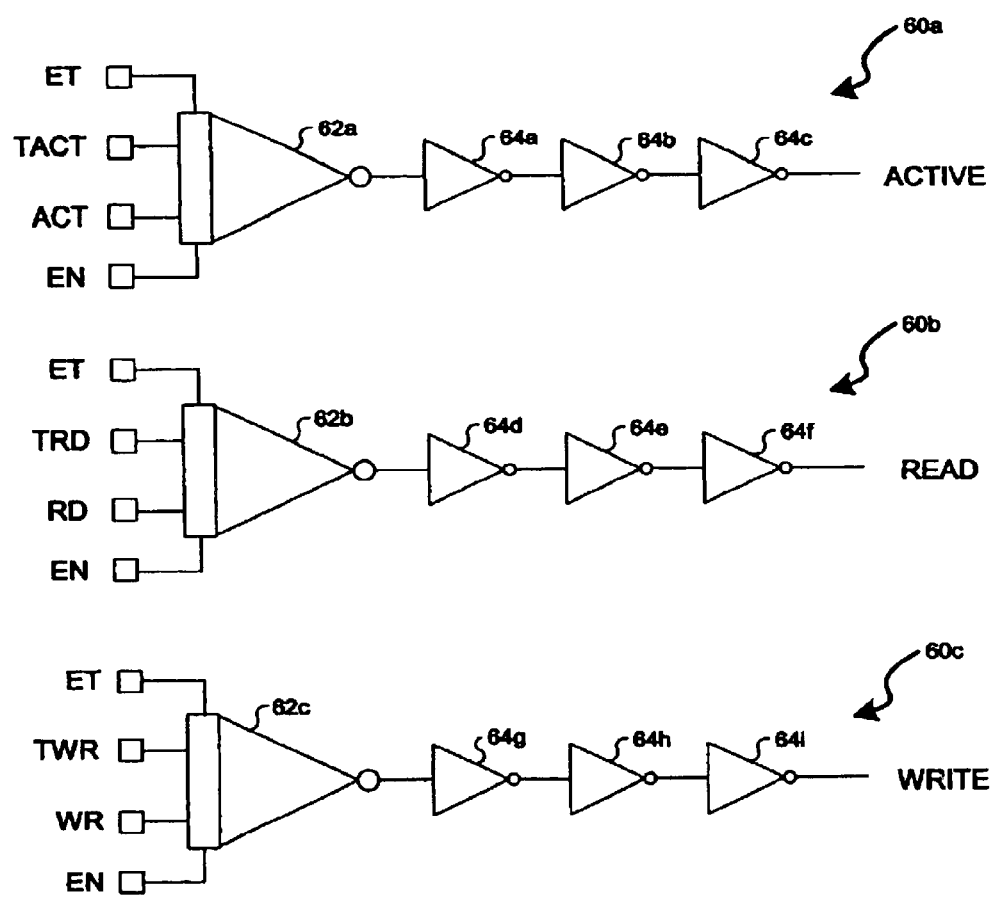
FIG._7

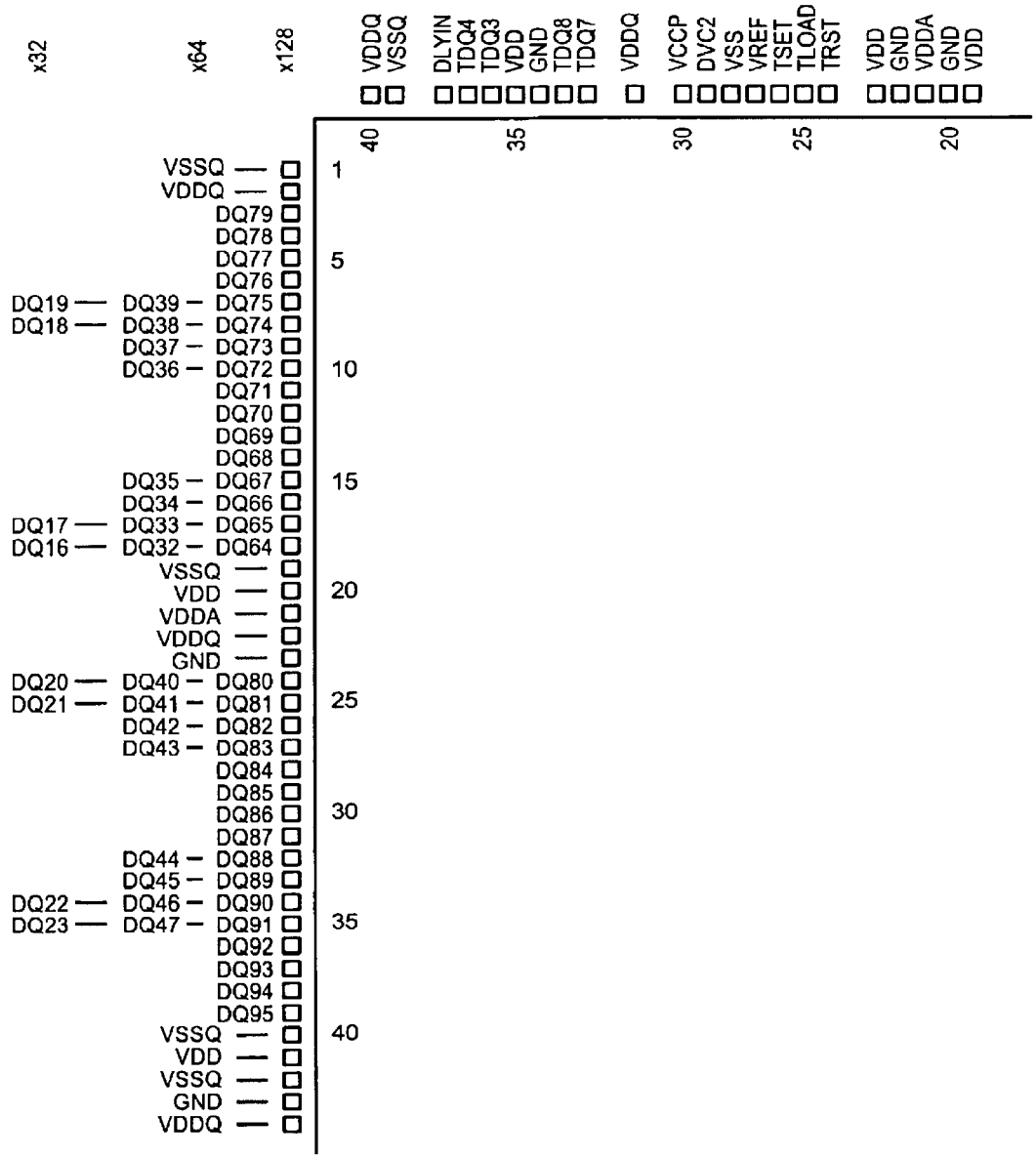

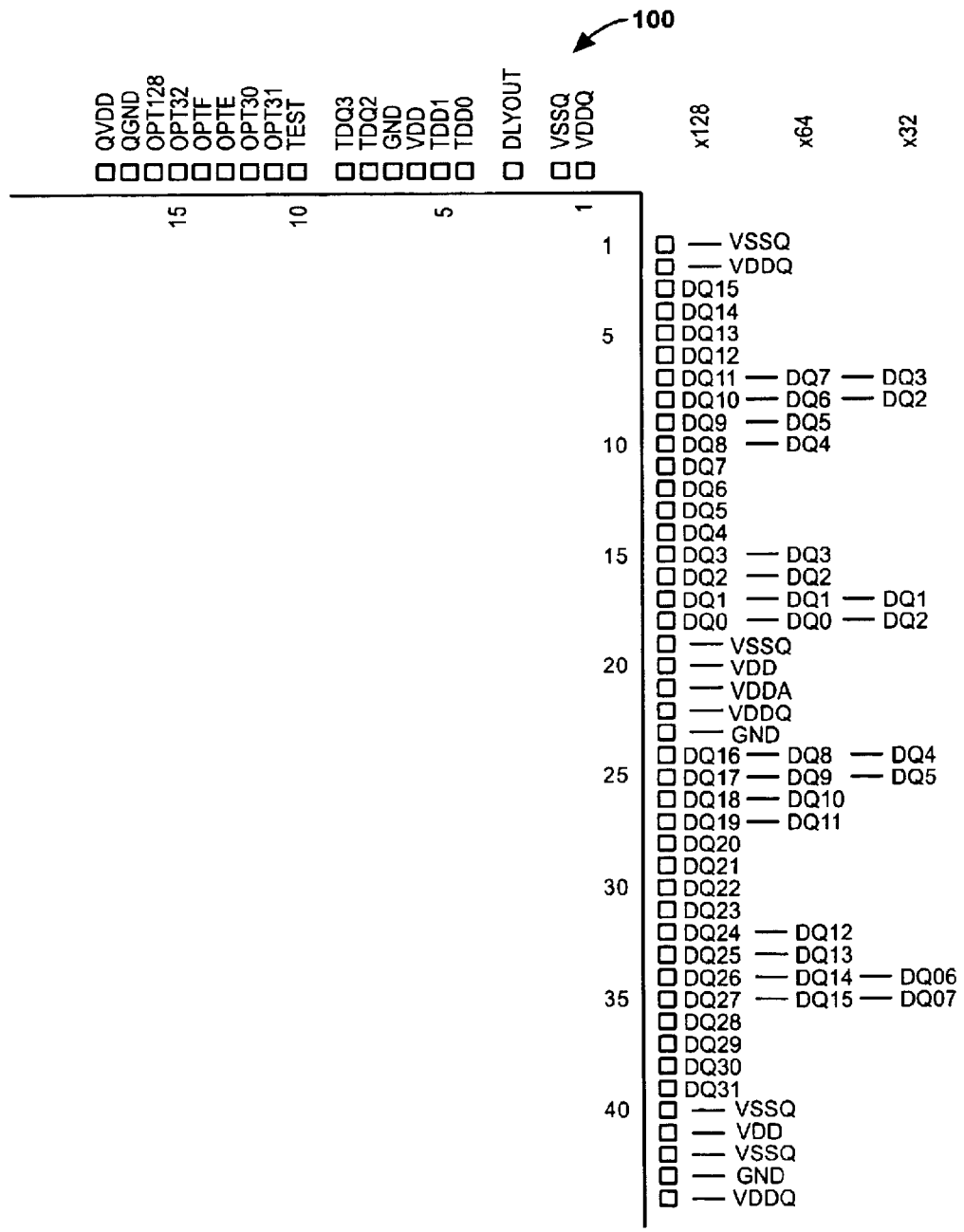
FIG._9A-2

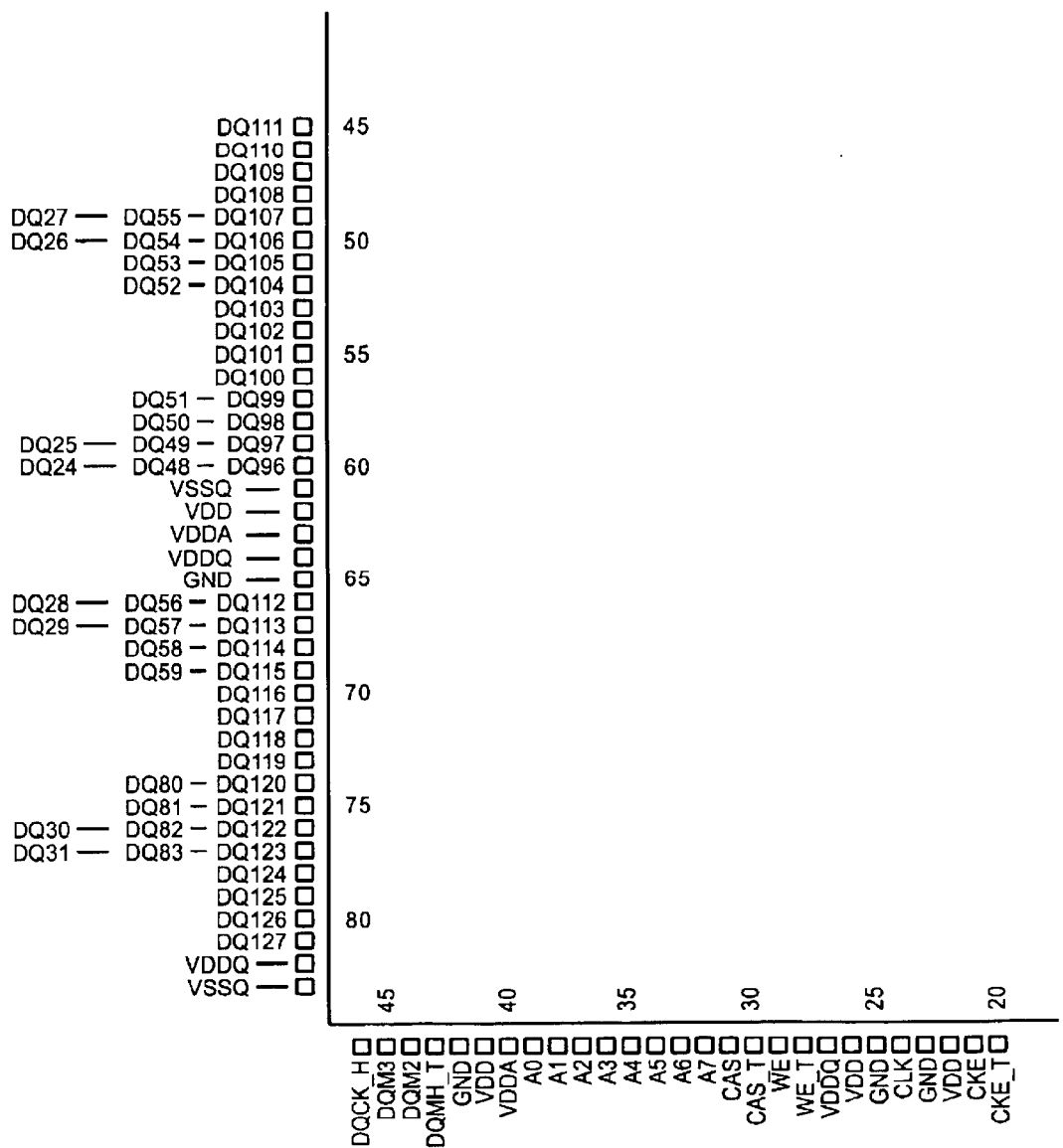
FIG._9A-3

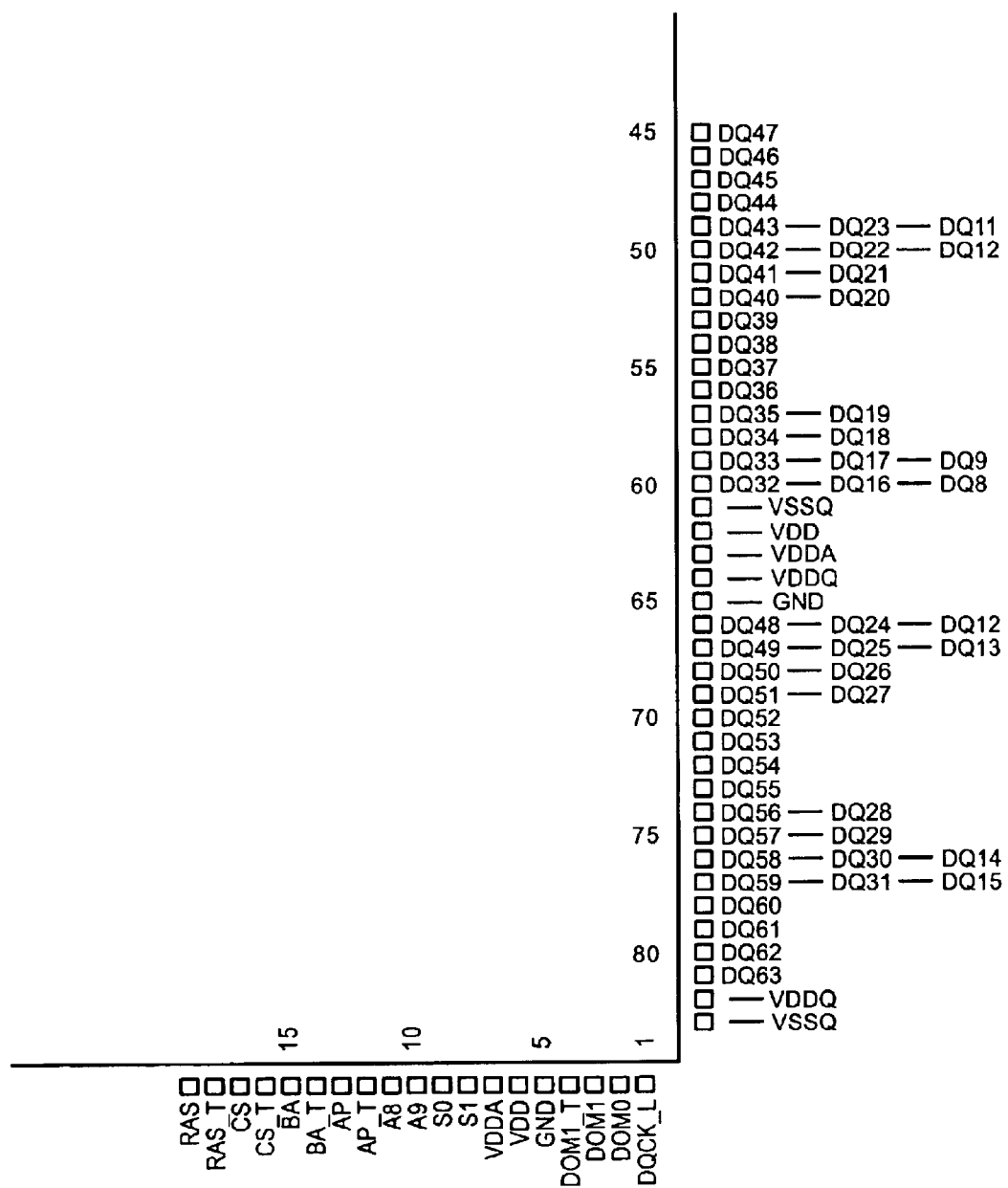
FIG._9A-4

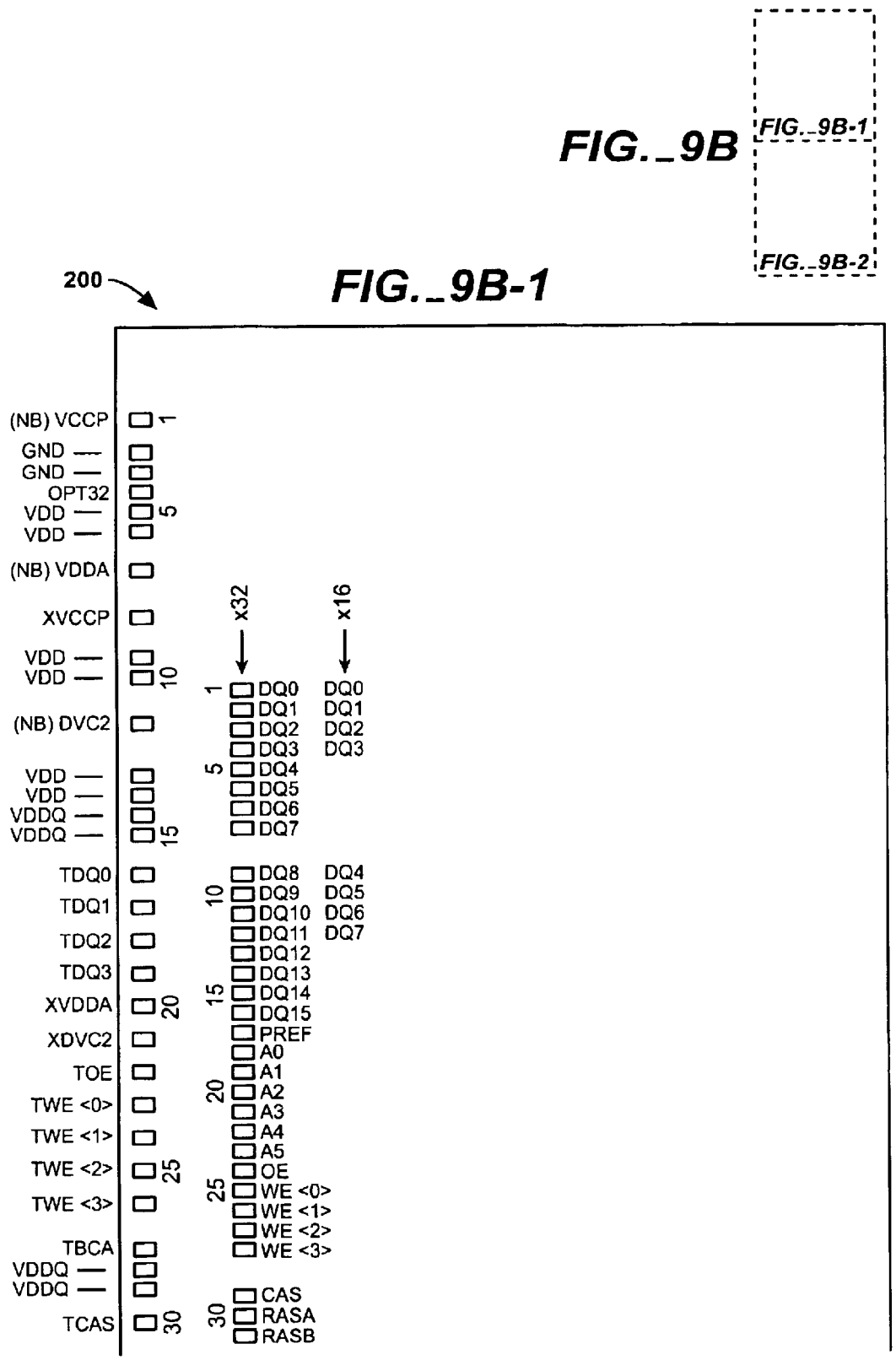

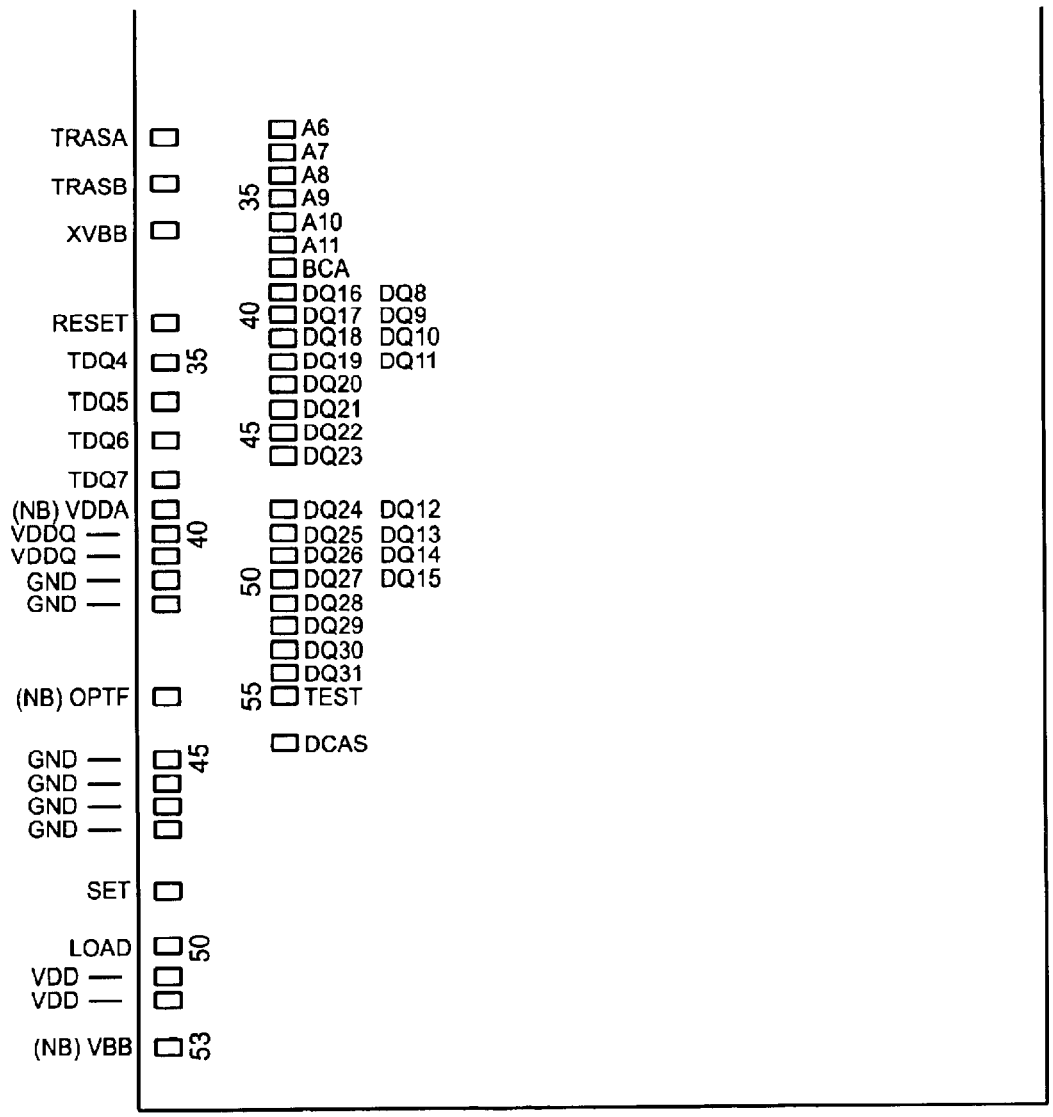
FIG._9B-2

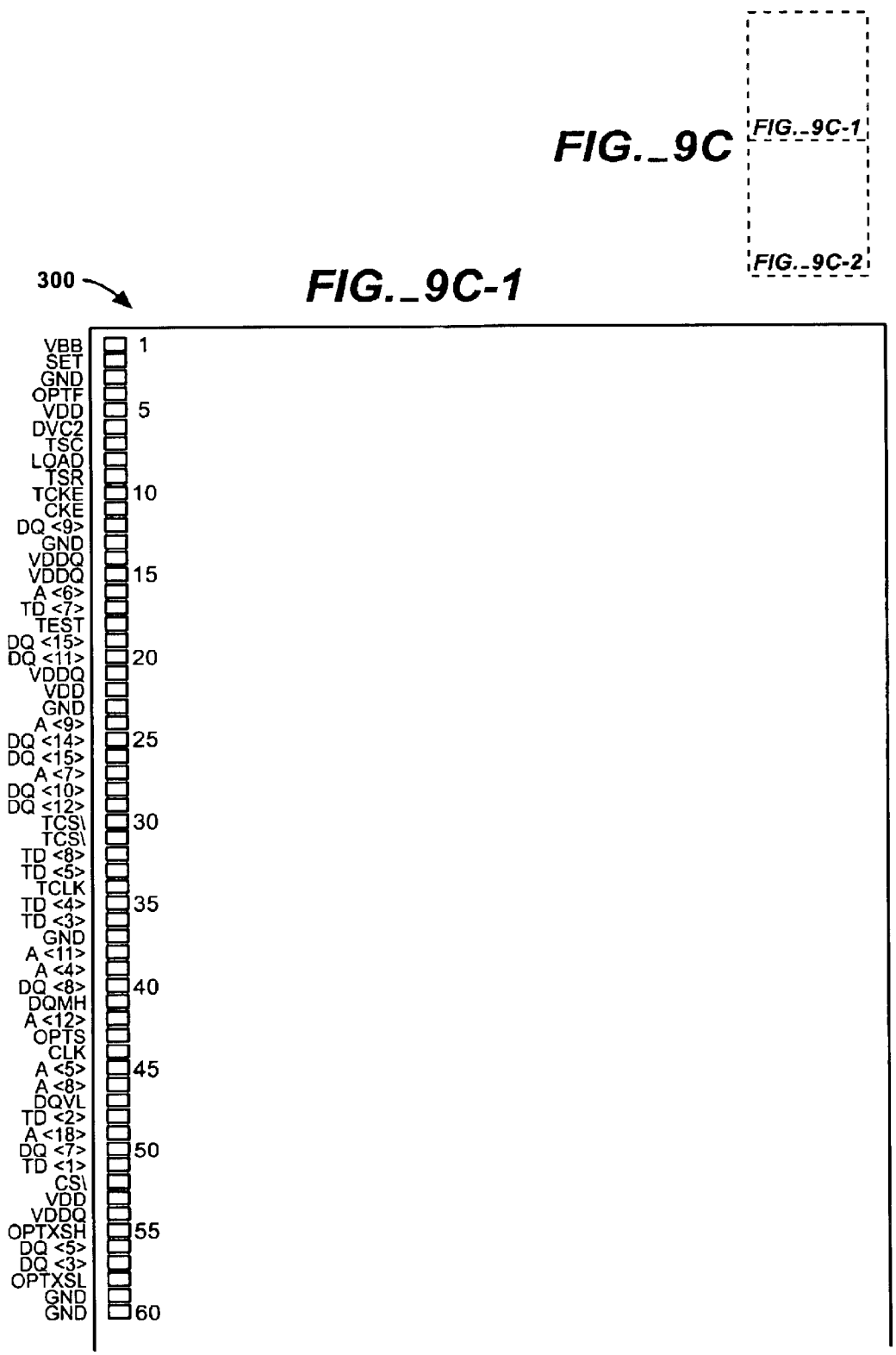

FIG._9C-2

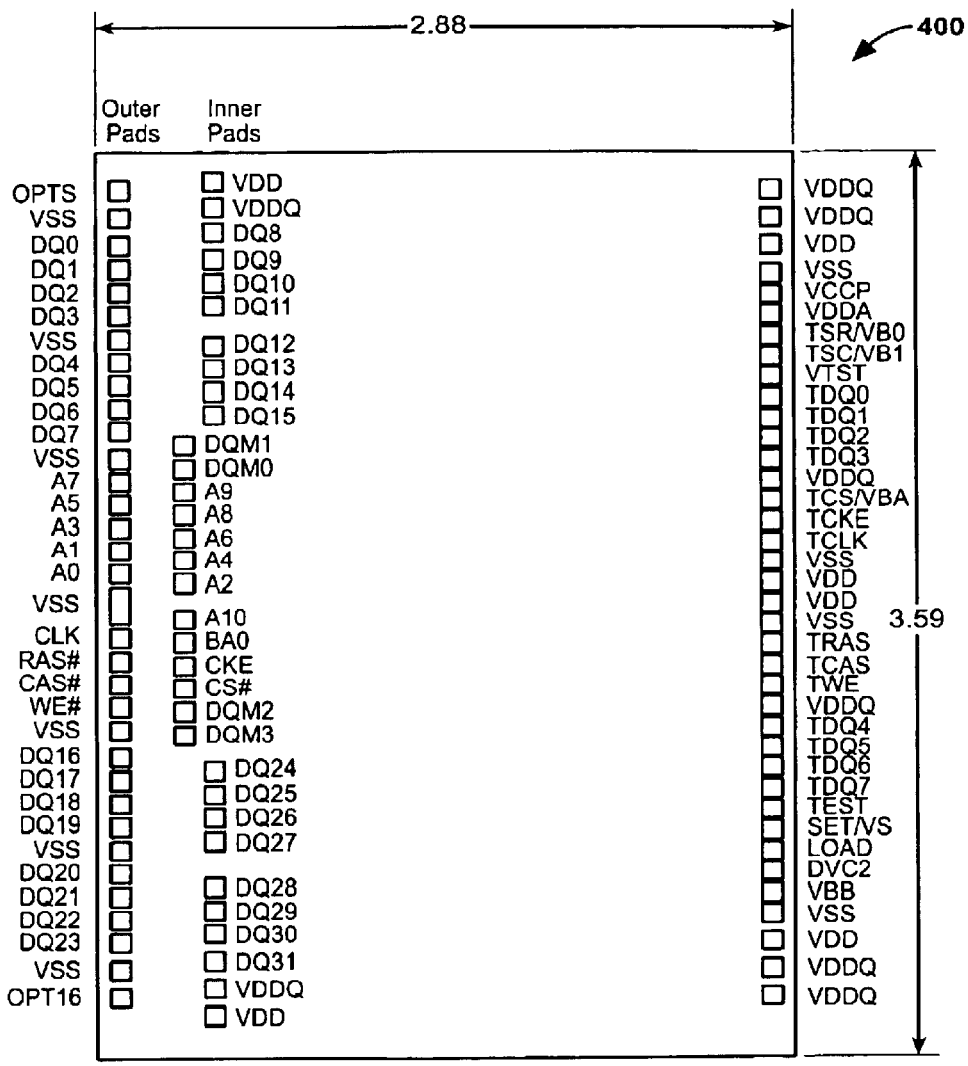
FIG._9D

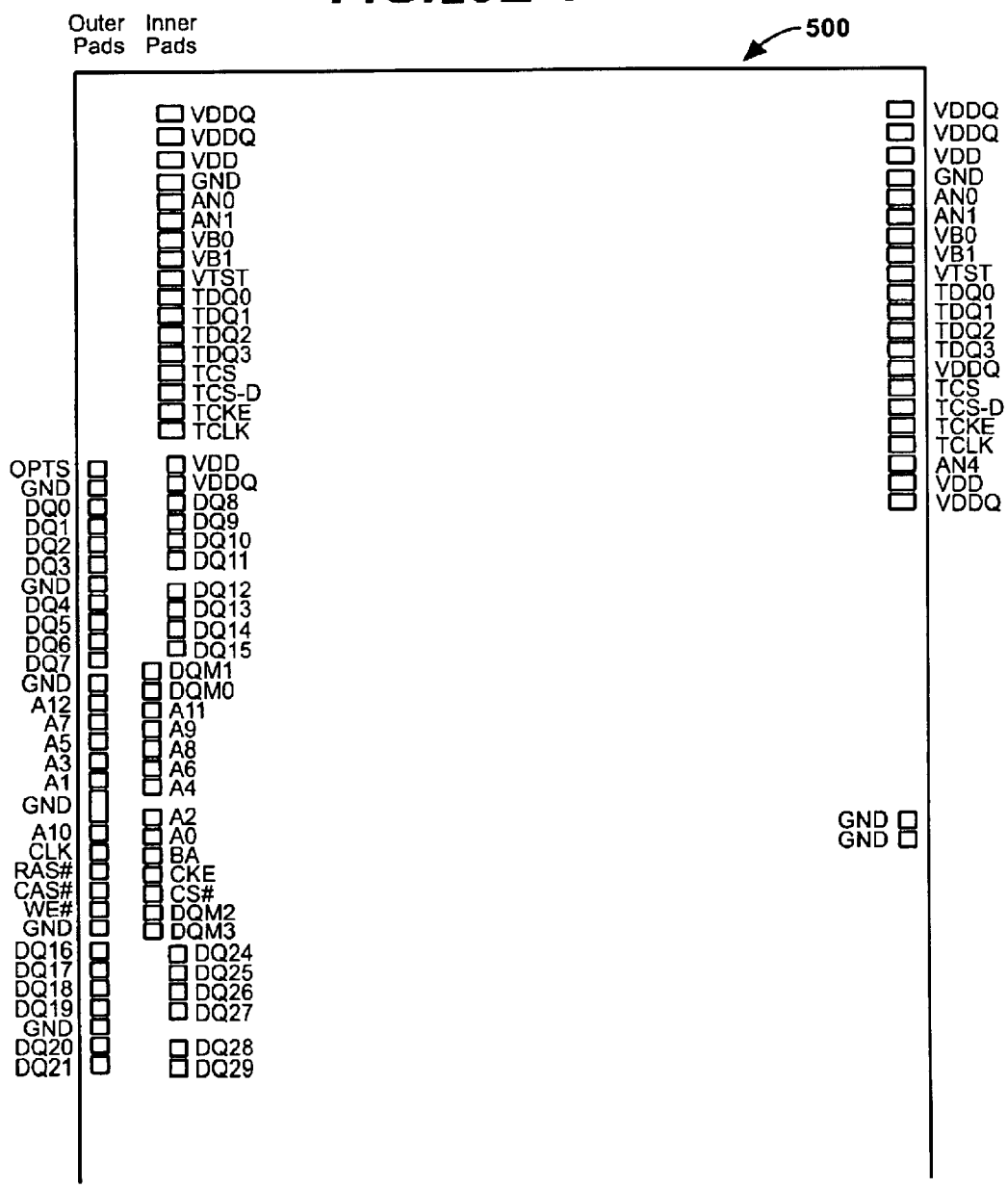

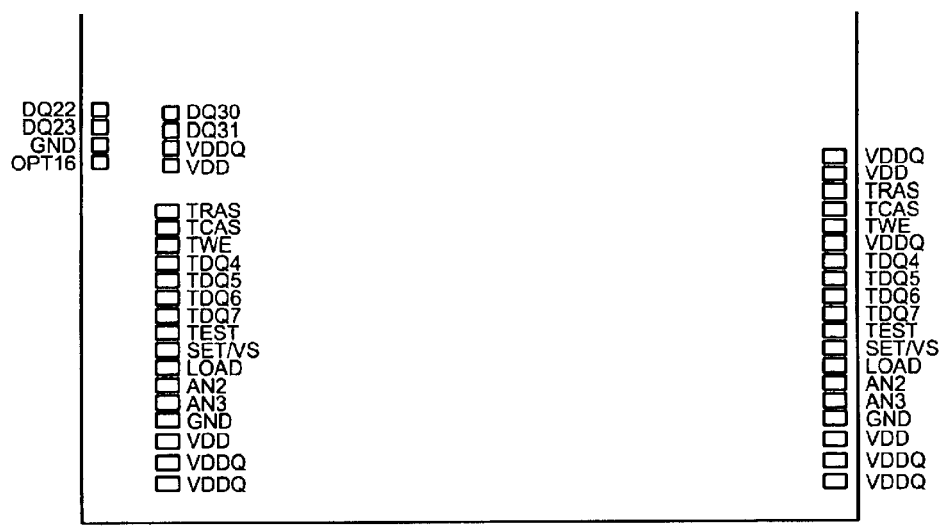
FIG._9E-2

BONDING PADS FOR TESTING OF A SEMICONDUCTOR DEVICE

CROSS-REFERENCE TO RELATED APPLICATION AND CLAIM OF PRIORITY

The present application is a continuation-in-part of, and claims the benefit of priority to, U.S. patent application Ser. No. 10/305,635, filed on Nov. 27, 2002, now U.S. Pat. No. 6,812,726, entitled "Entering Test Mode and Accessing of a Packaged Semiconductor Device," the entirety of which is incorporated by reference herein.

TECHNICAL FIELD OF THE INVENTION

The invention relates generally to the field of semiconductor integrated circuits, and more particularly, to bonding pads for testing of a semiconductor device.

BACKGROUND

A semiconductor or integrated circuit (IC) device may comprise many miniaturized circuits implemented in a semiconductor substrate. IC devices must be tested in order to ensure proper operation before they are used. IC devices can be tested in a limited fashion using built-in self test (BIST) circuitry that is implemented within the IC devices themselves. BIST testing however, is incomplete and does not test all aspects of operation. Thorough testing of an IC device is accomplished with complex external testing equipment. In order for complex test equipment to be used, many dedicated input/output (I/O) pins are typically required for allowing the test equipment to input various test patterns, codes, and data, and to stress the circuitry of the IC device. In an environment where multiple IC devices are combined within a single package, however, it may be desirable to limit the total number of I/O pins or leads, for example, so that the package with multiple IC devices fits into a similar size "footprint" as a package containing only one of the IC devices. Furthermore, for such components having multiple IC devices contained therein but with a limited number of input/output leads, it can be difficult if not impossible to use external testing equipment for testing the IC devices thoroughly.

SUMMARY

According to one embodiment of the present invention, a system is provided for testing a first integrated circuit chip to be packaged along with at least a second integrated circuit chip in a semiconductor device, wherein at least some external terminals for the semiconductor device are to be shared by the first and second integrated circuit chips, and wherein the first integrated circuit chip is designed for normal operation and a test mode. The system on the first integrated circuit chip includes a first bonding pad for a SET signal, a second bonding pad for a LOAD signal, a third bonding pad for a TEST signal, and a plurality of bonding pads for corresponding TDQ signals. The SET, LOAD, and TEST signals are used to transition the first integrated circuit chip from normal operation into the test mode and to enable test codes to be loaded into the first integrated circuit during a programming phase of the test mode. The TDQ signals are used to load test codes into the first integrated circuit during the programming phase and to read/write data to and from the first integrated circuit during an access phase of the test mode.

According to another embodiment of the present invention, a memory chip is provided for packaging along with at least a system chip in a semiconductor device, wherein at least some external terminals for the semiconductor device are to be shared by the memory chip and the system chip, wherein the memory chip is designed for normal operation and a test mode. The memory chip includes a first group of bonding pads for communicating TEST, SET, and LOAD signals operable to transition the first integrated circuit chip from normal operation into the test mode and to enable test codes to be loaded into the memory chip during a programming phase of the test mode. A second group of bonding pads are for communicating a plurality of TDQ signals operable to load test codes into the memory chip during the programming phase and to read/write data to and from the memory chip during an access phase of the test mode.

According to yet another embodiment of the present invention, a first integrated circuit chip is provided for packaging along with at least a second integrated circuit chip in a semiconductor device, wherein at least some external terminals for the semiconductor device are to be shared by the first and the second integrated circuit chips, wherein the first integrated circuit chip is designed for normal operation and a test mode. The first integrated circuit chip includes up to eleven bonding pads for complete testing of the first integrated circuit chip, wherein the up to eleven bonding pads are for communicating TEST, SET, LOAD, and up to eight TDQ signals. The TEST, SET, and LOAD signals are operable to transition the first integrated circuit chip from normal operation into the test mode and to enable test codes to be loaded into the first integrated circuit chip during a programming phase of the test mode. The up to eight TDQ signals are operable to load test codes into the first integrated circuit during the programming phase of the test mode and to read/write data to and from the first integrated circuit chip during an access phase of the test mode.

Important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which:

FIG. 1A is a block diagram of an exemplary semiconductor device, according to an embodiment of the present invention.

FIG. 1B is a block diagram of another exemplary semiconductor device, according to an embodiment of the present invention.

FIG. 2A is schematic diagram of an exemplary implementation of a test buffer multiplexer circuit, according to an embodiment of the present invention.

FIG. 2B is schematic diagram of another exemplary implementation of a test buffer multiplexer circuit, according to an embodiment of the present invention.

FIG. 2C is schematic diagram of yet another exemplary implementation of a test buffer multiplexer circuit, according to an embodiment of the present invention.

FIG. 3 is a schematic diagram of an exemplary implementation of an input buffer circuit.

FIG. 4 is a schematic diagram of an exemplary implementation of a test input control buffer circuit, according to an embodiment of the invention.

FIG. 5 is a schematic diagram of an exemplary implementation of a level detect circuit, according to an embodiment of the invention.

FIG. 6 is a schematic diagram of an exemplary implementation of a circuit for generating enable test and enable normal signals, according to an embodiment of the invention.

FIG. 7 is a schematic diagram of an exemplary implementation of control signal multiplexer circuits, according to an embodiment of the invention.

FIG. 8 is an exemplary timing diagram of a set and load sequence, according to an embodiment of the invention.

FIG. 9A is a diagram of an exemplary bonding pad layout, according to an embodiment of the invention.

FIG. 9B is a diagram of another exemplary bonding pad layout, according to an embodiment of the invention.

FIG. 9C is a diagram of yet another exemplary bonding pad layout, according to an embodiment of the invention.

FIG. 9D is a diagram of still yet another exemplary bonding pad layout, according to an embodiment of the invention.

FIG. 9E is a diagram of another exemplary bonding pad layout, according to an embodiment of the invention.

DETAILED DESCRIPTION

The embodiments of the present invention and their advantages are best understood by referring to FIGS. 1 through 9E of the drawings. Like numerals are used for like and corresponding parts of the various drawings.

Semiconductor Devices

FIGS. 1A and 1B illustrate exemplary semiconductor devices 10 and 50 in which systems and methods, according to various embodiments of the invention, can be incorporated and used. Semiconductor devices 10 and 50 represent any type of integrated circuit (IC) device (also referred to herein as a packaged device) that may require testing, such as, for example, by external automated test equipment or an integrated circuit tester. Each of semiconductor devices 10 and 50 can be packaged as a standard ball grid array (BGA) or thin quad flatpack (TQFP) having 144 pins or more. However, other types of packaging may be used. For example, the packaging may have a ceramic base with wire bonding or employing thin film substrates, and mounting on a silicon substrate or a printed circuit board (PCB) substrate. The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

FIG. 1A is a block diagram of an exemplary semiconductor device 10, according to an embodiment of the present invention. As depicted, semiconductor device 10 may comprise a system integrated circuit (IC) 12 and a memory 14. Each of system IC 12 and memory 14 can be implemented in a separate semiconductor die (commonly referred to as a "chip"). Each die is a monolithic structure formed from, for example, silicon or other suitable material. Accordingly, semiconductor device 10 can be referred to as a "multi-chip module" (MCM).

System IC 12 can be a chip with logic circuitry, such as, for example, an application specific integrated circuit (ASIC), a processor, a microprocessor, a microcontroller, a field programmable gate array (FPGA), programmable logic device (PLD), complex programmable logic device (CPLD), or other logic device. Memory 14 can be an IC memory chip, such as, for example, static random access memory (SRAM), dynamic random access memory (DRAM), synchronous DRAM (SDRAM), non-volatile random access memory (NVRAM), and read only memory (ROM), such as erasable programmable ROM (EPROM), electrically erasable programmable ROM (EEPROM), and flash memory.

System IC 12 and memory 14 may work in conjunction. Memory 14 provides storage capability for data/information that is provided from system IC 12 or some other components. System IC 12 provides processing capability for operating on data/information, and may retrieve information from and store information into memory 14. In normal operation for semiconductor device 10, signals for data/information (DQ signals) may transfer information between memory 14 and system IC 12.

System IC 12 and memory 14 may each comprise one or more bonding pads 16, which can be connected via, for example, bonding wires 18, to provide communication between the chips and/or other components within or external to semiconductor device 10. As used herein, the terms "connected," "coupled," or any variant thereof, means any connection or coupling, either direct or indirect, between two or more elements. For clarity, in FIG. 1A, only a portion of the bonding pads 16 and bonding wires 18 are provided with reference numerals. At least some of the bonding pads 16 and bonding wires 18 may support communication directly between system IC 12 and memory 14.

In one embodiment, system IC 12 and memory 14 may be mounted in a side-by-side arrangement on a printed circuit board (PCB) substrate, such as for a multi-chip package (MCP). Such PCB substrate may also have bonding pads 16 and traces 19. In one embodiment, at least some traces 19 formed on either memory 14 or system IC 12 may be used for pin-out for the other chip.

As shown, semiconductor device 10 includes a number of external terminals 20 which can be, for example, input/output (I/O) leads or pins. For clarity, in FIG. 1A, only some of the external terminals 20 are provided with reference numerals. In general, these external terminals 20 enable the components within semiconductor device 10 to exchange data/information with components external to device 10. In one embodiment, one or more of these external terminals 16 may be connected to and serve both the system IC 12 and memory 14. That is, a terminal 20 which provides I/O capability for the system IC 12 may also provide I/O capability for memory 14.

To verify that semiconductor device 10 is operating properly, the components contained therein should be thoroughly tested. For this purpose, in one embodiment, memory 14 may receive signals from test equipment that is external to device 10. One or more test buffer multiplexer circuits 22 may be provided or incorporated in memory 14. Each multiplexer circuit 22 generally functions to multiplex between signals that are generated in normal operation of semiconductor device 10 and signals that are generated for testing of semiconductor device 10. The signals generated in normal operation may originate from system IC 12, whereas the signals for testing may originate from external test equipment.

Memory 14 may also comprise an on-chip sequence pattern generator, such as that described in related U.S. application Ser. No. 10/205,883 entitled "Internally Generating Patterns For Testing In An Integrated Circuit Device," filed on Jul. 25, 2002, assigned to the same assignee and incorporated by reference herein in its entirety. Such pattern generator may comprise a test column address counter and a test row address counter. The test column address counter may increment independently of the test row address counter. The address counters may function to internally generate sequences of numbers for use as addresses during testing.

If memory 14 were packaged as a discrete component (i.e., separate from system IC 12), thorough testing of the memory would require full access to all data, control, and access points of memory 14 so that complete test patterns could be input and extracted from the memory. But since memory 14 is packaged with system IC 12 in semiconductor device 10 and various access points of memory 14 are connected to system IC 12 for normal operation, test buffer multiplexer circuits 22 enable full access to memory 14 by multiplexing between signals from system IC 12 in normal operation and signals from external test equipment during testing. In this way, the external terminals 20 which are shared between the memory 14 and system IC 12 can imitate test pins which would be dedicated if memory 14 were packaged separately.

In one embodiment, the signals which are multiplexed can be clock enable (CKE), chip select (CS), row address strobe (RAS), column address strobe (CAS), write enable (WE), data read/write mask (DQM), bank select (BA), all row precharge (AP), bi-directional test data I/O (TD), set (SET), and load (LOAD), and respective testing counterparts for the same. It should be understood, that in other embodiments, signals in addition to or other than one or more of those described immediately above may be multiplexed.

In addition, one or more external terminals 20 may be dedicated (i.e., not shared between system IC 12 and memory 14) for testing of memory 14. In one embodiment, these dedicated terminals 20 can receive signals for test (TEST), analog word-line voltage (VCCP), and analog memory substrate voltage (VBB). The TEST signal generally functions to put memory 14 is test mode. The VCCP and VBB signals are used for stressing the memory 14 by providing voltage levels significantly above or below VDD and VSS. In another embodiment, only one external terminal 20—i.e., the one for the TEST signal—is dedicated for the testing of memory 14, and the signals for VCCP and VBB are generated internally within memory 14. This reduces pin count for the semiconductor device 10. In yet another embodiment, the external terminal which receives the TEST signal may be shared between the memory 14 and system IC 12. In such case, a voltage level which differs from the voltage levels used in normal operation is applied to the external terminal to put the memory 14 into test mode, as discussed herein in more detail.

Semiconductor device 10 can work in normal operation or be placed in testing mode. In normal operation, system IC 12 and memory 14 may cooperate to receive, process, store, and output data and information. In testing mode, one or both of system IC 12 and memory 14 may be functionally tested to verify proper operation. With embodiments of the present invention, memory 14 can be tested completely separately from system IC 12.

In one embodiment, semiconductor device 10 (and in particular, memory 14) can be placed in testing mode with various control signals, such as, for example, the TEST, SET and LOAD signals. Memory 14 may include a test input control buffer circuit 40, which generally functions to receive and buffer control signals for programming of the memory 14. In some embodiments, the TEST signal is made a high value (or "1", such as VDD) and remains high throughout in-package testing. The SET and LOAD signals are initially at a low value (or "0", such as GND). Then the SET and LOAD signals are pulsed high for predetermined periods (e.g., 10 ns) to enable test buffer multiplexer circuits 22 on memory 14. The device 10 is now in test mode.

In test mode, there may be two phases: a programming phase and an access phase. In the programming phase, the memory 14 can be set up or programmed for testing. This set up can include, for example, loading test addresses and sequential test data patterns (or codes) into various parts of the memory 14 (e.g., row and column test counters). In one embodiment, one or more test data (TDQ) signals may be used to program test modes, load test addresses, load test vectors, and load test patterns. The SET and LOAD signals can be used to enable test addresses or vectors to be set and loaded. An exemplary timing diagram illustrating the pulses for SET and LOAD signals to program a code in memory 14 is shown and described with reference to FIG. 8 below. All test mode programming can be performed asynchronously (i.e., no clock is required). In one embodiment, a test control (TCNT) is set to a high value ("1") to cause the memory 14 to exit the programming phase and enter the access phase. New test addresses and vectors can no longer be programmed.

In the access phase, the memory 14 is actually operated using the test addresses and test patterns. In one embodiment, all external and burst counter addresses are ignored by memory 14 while in access phase. The memory 14 only recognizes the addresses from the programmed row and column test counters. The TDQ signals are now used to read and write data to memory 14. A test stop row (TSR) counter signal may be used to stop the row address counter, and a test stop column (TSC) counter signal may be used to stop the column address counter while in access phase. This allows independent incrementation (or decrementation) of row and column addresses. Both the TSR and TSC counter signals may be independent of the CLK signal. In general, with some embodiments, programming of memory 14 during testing can be asynchronous. In other embodiments or as an option, programming can be synchronous for memory 14. Also, during access phase, the memory 14 may operate synchronously or asynchronously, depending on the memory specification.

To exit test mode, in one embodiment, the TEST signal is brought to a low value ("0"), which clears all test operations and disables the test input buffers.

With the systems and methods, according to various embodiments of the invention, an IC chip (e.g., memory 14) which is packaged along with one or more other chips (e.g., system IC 12) can be fully tested without requiring a significant number of dedicated I/O terminals. Control signals from complex external test equipment (e.g., a standard external memory tester) can be provided to all data, control, and access pads of the desired IC chip for thorough and complete testing using a variety of test patterns and sequences. These embodiments provide complete and flexible testing of IC devices.

Note that the use of TDQ signals (and corresponding bond pads) is made necessary because memory 14 is designed to be packaged along with system IC 12 and, as such, the DQ signals (which are used in normal operation as described herein) are not readily available for the input or output of data/information between memory 14 and external test equipment for testing of memory 14. Nonetheless, it may be desirable in some embodiments to minimize the number of TDQ signals used. In particular, if fewer TDQ signals are used for programming and loading, the packaging (e.g., pin-out or "footprint") of memory 14 along with the system IC 12 will not be that different from the packaging of system IC 12 by itself. Thus, a lower number of TDQ signals may translate into a better packaging arrangement for semiconductor device 10. In some embodiments, up to four TDQ signals may be provided and used. In other embodiments, up to eight TDQ signals are provided and used. In some embodiments, a single TDQ signal could be used. Note, however, that as the number of TDQ signals is reduced, there is less parallel between TDQ signals used for testing of memory 14 and the DQ signals used for normal operation.

In order to reduce the number of TDQ signals used, various signals either generated externally (e.g., by test equipment) or internally within memory 14 may be compressed, with the corresponding data storing into a register, and sequentially output from the register. Such techniques are described in more detail in related U.S. application Ser. No. 09/666,208 entitled "Chip Testing Within a Multi-Chip Semiconductor Package," filed on Sep. 21, 2000, which is assigned to the present assignee and incorporated by reference herein in its entirety. In some embodiments, the systems and methods described herein can be used in conjunction with the systems and methods described in such related U.S. Application.

FIG. 1B is a block diagram of another exemplary semiconductor device 50, according to an embodiment of the present invention. Semiconductor device 50 can be similar in many respects to semiconductor device 10 depicted in FIG. 1A. That is, semiconductor device 50 may comprise a system IC 12 and a memory 14 (each with bonding pads 16 provided thereon), and external terminals 20 for communicating data/information into and out of semiconductor device 50. Memory 14 receives signals from system IC 12. Furthermore, memory 14 may comprise one or more test buffer multiplexer circuits 22 for enabling multiplexing between signals generated in normal operation and signals generated for testing, thereby allowing memory 14 to be thoroughly tested with external test equipment.

In semiconductor device 50, system IC 12 and a memory 14 are provided in stacked arrangement. In this arrangement, system IC 12 may be attached to memory 14 using, for example, any suitable adhesive. Traces 19 may be formed on memory 14 for pin-out for system IC 12. Furthermore, although not depicted, some traces 19 may be formed on system IC 12 for pin-out for memory 14.

In one embodiment, one or both of the test analog voltages (i.e., word-line voltage (VCCP) and analog memory substrate voltage (VBB)) can be multiplexed with voltages used in normal operation. For this, respective test buffer multiplexer circuits 22 may be provided or incorporated in memory 14.

Test Buffer Multiplexer Circuit

FIG. 2A is schematic diagram of an exemplary implementation of a test buffer multiplexer circuit 22, according to an embodiment of the present invention. Test buffer multiplexer circuit 22 may be implemented or incorporated in a memory 14 to supporting the testing thereof. In this embodiment, as depicted, test buffer multiplexer circuit 22 comprises buffer circuits 30a, 30b and pass gate circuits 32a, 32b.

One buffer circuit 30b may be connected to receive a signal (e.g., data (DQ)) from system IC 12, while the other buffer circuit 30a may be connected to receive a corresponding test signal (e.g., test data (TDQ)) from a testing machine via an external terminal 20. Buffer circuit 30a is enabled by an enable test (ET) signal, while buffer circuit 30b is enabled with an enable normal (EN) signal. The ET and the EN signals can be complementary signals, and may both be supported by the same external pin or lead which, for example, receives the TEST signal. This external pin can be either dedicated for receiving the TEST signal to the place the memory 14 in test mode, or alternatively, shared between the memory 14 and a system IC 12. An exemplary implementation of a buffer circuit 30 is depicted in FIG. 3.

Pass gate circuit 32a is coupled at its input to receive the output of buffer circuit 30a. Pass gate circuit 32b is coupled at its input to receive the output of buffer circuit 30b. Both pass gate circuits 32 receive the enable test and enable normal signals. Each pass gate circuits 32 generally function to pass the value of a signal appearing at its input as the value of its output signal upon a particular combination of values for the enable test and enable normal signals. For example, in one embodiment, when the enable test signal has a high value (or "1") and the enable normal has a low value (or "0"), then the value of the output signal from buffer circuit 30a appears at output Y for the test buffer multiplexer circuit 22. An exemplary implementation of pass gate circuit 32 is described in related U.S. application Ser. No. 09/967,389 entitled "Testing of Integrated Circuit Devices," filed on Sep. 28, 2001, assigned to the same assignee and incorporated by reference herein in its entirety.

Although only a single test buffer circuit 22 is depicted here in FIG. 2A for the data signal and its counterpart test signal, it should be understood that a plurality of test buffer circuits 22 may be provided on a memory 14 for multiplexing various other signals from a system IC 12 (e.g., CLK, CKE, CS, RAS, CAS, WE, DQM, BA, and AP) and their counterpart test signals (e.g., TCLK, TCKE, TCS, TRAS, TCAS, TWE, TDQM, TBA, and TAP).

In operation, when the memory 14 on which test buffer multiplexer circuit 22 is implemented is in normal operation, then the value of the signal from the system IC (e.g., DQ) is buffered and passed as the output Y of the multiplexer circuit 22. Alternatively, when the memory 14 is placed in test mode, then the value of signal from external testing equipment (e.g., TDQ) is buffered and passed as the output Y of the multiplexer circuit 22.

FIG. 2B is schematic diagram of another exemplary implementation of a test buffer multiplexer circuit 22, according to an embodiment of the present invention. In this embodiment, as depicted, test buffer multiplexer circuit 22 comprises buffer circuits 34a, 34b and NAND gate 36.

Buffer circuits 34b may be connected to receive a signal (e.g., data (DQ)) from system IC 12, and buffer circuit 34a may be connected to receive a corresponding test signal (e.g., test data (TDQ)) from a testing machine via an external terminal 20. Buffer circuits 34a and 34b are enabled by the enable test (ET) and enable normal (EN) signals, respectively. NAND gate 36 receives and performs a "NAND" operation on the outputs of buffer circuits 34a and 34b. NAND gate 36 outputs a value of the Y signal, which is the output for the multiplexer circuit 22.

As with FIG. 2A, although only a single test buffer circuit 22 is depicted here in FIG. 2B for the data signal and its counterpart test signal, it should be understood that a plurality of test buffer circuits 22 may be provided on a memory 14 for multiplexing various other signals from a system IC 12 and their counterpart test signals.

FIG. 2C is schematic diagram of yet another exemplary implementation of a test buffer multiplexer circuit 22, according to an embodiment of the present invention. In this embodiment, as depicted, test buffer multiplexer circuit 22 comprises buffer circuits 50a, 50b, 50c, inverter gates 52a, 52b, 52c, 52d, data buffers 54a, 54b, a multiplexer (MUX) 56, and a NOR gate 58.

Buffer circuit 50a and inverter gates 52a, 52b may be part of a path for inputting program code data into memory 14, for example, during a programming phase of test mode for the memory 14. Buffer circuit 50a may receive a test signal (e.g., test data (TDQ)) from an external test machine. Buffer circuit 50a can be enabled by a signal that is derived from logic operations on the enable test (ET) and a test control or test counter (TCNT) signal. The output of this buffer circuit 50a and inverter gates 52a, 52b is a TDA signal for programming memory 14. In one embodiment, eight TDA signals (i.e., TDA[0:7]) may be supported for programming up to 256 test codes. Eight TDQ signals (i.e., TDQ[0:7]) may be supported as well. It other embodiments, more or less than eight (e.g., sixteen or four) TDQ signals may be used.

In one embodiment, the TCNT signal may default to a low value upon entry into test mode. If the memory 14 is in the programming phase of test mode, the TCNT signal may have a low value. If memory 14 is in the access phase of test mode, test control (TCNT) signal may have a high value. TCNT signal may be set to a high value using the SET and LOAD (code) signals. For example, in one embodiment, the TCNT signal can be set to VDD by bringing the SET signal to a high value with the values of TDQ[7:0]=00110000. The LOAD signal is used for loading registers, such as test address or test pattern.

Buffer circuit 50b and data buffer 54a may be part of a path for inputting test data into memory 14, for example, during an access phase of test mode for the memory 14. Buffer circuit 50b is enabled by the enable test (ET) signal and may receive the test data (TDQ)) from an external test machine. Data buffer 54a is connected to receive the output signal of buffer circuit 50b and a clock (CLK) signal. Data buffer 54a latches the output of circuit 50b and may output the same on an edge of the CLK signal.

Buffer circuit 50c and data buffer 54b may be part of a path for inputting data into memory 14, for example, during normal operation for the memory 14. Buffer circuit 50c is enabled by the enable normal (EN) signal and may receive the data (DQ)) from system IC 12. Data buffer 54b is connected to receive the output signal of buffer circuit 50c and a clock (CLK) signal. Data buffer 54b latches the output of circuit 50c and may output the same on an edge of the CLK signal.

Multiplexer 56 is connected to receive the output signals of data buffers 54a and 54b, and can be enabled with a TEST signal, a TSTEN signal, or a TCNT signal. Depending on the values of the EN and ET signals, multiplexer 56 will pass (via inverter gate 52c) either the output of data buffer 54a or the output of data buffer 54b to other circuitry on memory 14. In particular, if memory 14 is in test mode (access phase), the output of data buffer 54a is provided to the memory 14 for testing of same. If memory 14 is in normal operating mode, the output of data buffer 54a is provided to the memory 14. In other embodiments, other circuit, such as a NAND gate, can be used instead of multiplexer 56.

Test Input Control Buffer Circuits

FIG. 4 is a schematic diagram of an exemplary implementation of a test input control buffer circuit 40, according to an embodiment of the invention. Test input control buffer circuit 40 may be implemented or incorporated in a memory 14 to supporting the testing thereof. Test input control buffer circuit 40 generally functions to receive and buffer control signals for programming of memory 14 during the programming phase of test mode. As depicted, test control buffer circuit 40 comprises a level detect circuit 42, input buffer circuits 44a, 44b, and 44c, and inverter gates 46a, 46b, and 46c.

Level detect circuit 42 is optional and can be provided as part of test input control buffer circuit 40 when the external pin or lead for receiving the TEST signal is shared between the memory 14 and a system IC 12. In such case, because it would be undesirable to inadvertently place memory 14 into test mode during normal operation, a voltage level which differs from the voltage levels used in normal operation is used for putting the memory 14 into test mode. This voltage level can be, for example, a negative voltage (e.g., −3V) or a higher than normal voltage (e.g., 7V if VDD for memory 14 is 3.3V). Level detect circuit 42 receives the external TEST signal (XTEST) and generates an internal test enable (TSTEN) signal that is provided to each of input buffer circuits 44a, 44b, and 44c. The TSTEN signal enables input buffer circuits 44. An exemplary implementation for level detect circuit 42 is depicted in FIG. 5.

Referring again to FIG. 4, if the external pin for receiving the TEST signal is dedicated, level detect circuit 42 is not needed and thus would not be present in test input control buffer circuit 40. In this case, the external TEST signal can be applied directly to input buffer circuits 44. In one embodiment, for this situation, a high value for the TEST signal causes memory 14 to be in test mode, while a low value for the TEST signal takes memory 14 out of test mode.

A separate combination of input buffer circuit 44 and inverter gate 46 is provided for each of a number of programming control (PRG) signals, such as, for example, the SET, LOAD, and RESET signals. For each combination, when the input buffer circuit 44 is enabled, the respective control signal is buffered in circuit 44 and output to the inverter gate 46 where the signal is inverted. The output of each inverter gate 46 is a respective program P signal (separately labeled P1, P2, P3). The program P signals may be provided to control the test programming of the memory 14 when it is in the programming phase of test mode. For example, these program P signals can be used to set flags and other conditions in memory 14.

It should be noted that in alternative implementations for a test input control buffer circuit 40, any number of input buffer circuits 44 and inverter gates 46, or any other suitable element could be used to support control signals that are in addition to, or instead of, the specific signals depicted in FIG. 4.

Enable Test and Enable Normal

FIG. 6 is a schematic diagram of an exemplary implementation of a circuit 80 for generating the enable test (ET) and the enable normal (EN) signals, according to an embodiment of the invention. As depicted, this circuit 80 comprises NAND gates 82a, 82b, 82c, delay circuits 84a, 84b, and inverter gates 86a, 86b, and 86c.

NAND gate 82a can be connected to receive the program P and TSTEN signals from the test input control buffer circuit 40. The program P signals can be associated with or correspond to the SET, LOAD, and RESET signals. The delay circuits 84a and 84b delay the output generated by the NAND gate 82a. The delay circuits 84a and 84b may also filter noise or voltage spikes, and may prevent unintentional entry into test mode. Delay circuits 84a and 84b may be replaced with a single, larger delay circuit in alternative embodiments.

NAND gates 82b and 82c are cross-connected at one input each. The other input of NAND gate 82b is connected to receive the output of delay circuit 84b. The other input of NAND gate 82b is connected to receive a test reset (TR) signal. The test reset signal, which may be derived from a reset signal, can be used to reset an individual test mode without completely exiting test mode. Inverter gates 86a and 86b are connected to receive the output of NAND gate 82b, while NAND gate 82d and inverter gate 86c are connected to receive the output of NAND gate 82c. The output of inverter gate 86b is the enable test (ET) signal, and the output of inverter gate 86c is the enable normal (EN) signal.

The ET and EN signals may be applied to the test buffer multiplexer circuit 22 (see FIGS. 2A, 2B, and 2C).

In operation, depending on the combination of values for the TSTEN and program P signals, circuit 80 will output particular values for the enable test (ET) and the enable normal (EN) signals for enabling the test or normal buffers.

Control Signal Multiplexer Circuits

FIG. 7 is a schematic diagram of an exemplary implementation of control signal multiplexer circuits 60a, 60b, and 60c, according to an embodiment of the invention. Control signal multiplexer circuits 60 may be implemented or incorporated in a memory 14 to supporting the testing thereof.

In general, each control signal multiplexer circuit 60 functions to receive, multiplex, and buffer a control signal and its counterpart test signal. These control signals can be, for example, an active (ACT) signal, a read (RD) signal, and a write (WR) signal, and the counterpart test signals can be a test ACT (TACT) signal, a test RD (TRD) signal, and a test WR (TWR) signal, respectively. The control signals (ACT, RD, and WR) may be received at pads 16 on memory 14 which are coupled to the system IC 12. The respective counterpart test signals (TACT, TRD, and TWR) may be received at pads which are connected to external terminals 20 that are shared between memory 14 and system IC 12. It should be understood, that in other embodiments, control signals in addition to or other than one or more of those described immediately above may be multiplexed.

As depicted, each control signal multiplexer circuit 60 comprises a multiplex buffer 62 (separately labeled 62a, 62b, and 62d) coupled to a plurality of inverter gates 64 (separately labeled 64a–64i).

In one embodiment, each multiplexer buffer 62 can be implemented with substantially similar circuitry as used for either of the implementations of test buffer multiplexer circuit 22 depicted in FIGS. 2A and 2B. Each multiplex buffer 62 receives an enable test (ET) signal, an enable normal (EN) signal, a respective control signal, and the counterpart test signal. During normal operation for memory 14, multiplex buffer 62 is enabled by the enable normal signal, which allows the respective control signal (e.g., ACT, RD, or WR) to be buffered and output by the multiplex buffer 62. In test mode, multiplex buffer 62 is enabled by the enable test signal, which allows the respective counterpart test signal (e.g., TACT, TRD, or TWR) to be buffered and output by the multiplex buffer 62.

The output signal from a multiplex buffer 62 is provided to the first in a respective sequence of inverter gates 64. As shown, three inventor gates 64 are provided in each sequence. The output of the last inverter gate 64 of each sequence is provided as a control signal to memory 14, for either normal operation or testing (depending on the ET and EN signals).

It should be noted that other control signal multiplexer circuits 60 may be provided to support control signals that are in addition to, or instead of, the specific signals depicted in FIG. 7.

Set and Load Sequence

FIG. 8 is an exemplary timing diagram of a set and load sequence 70, according to an embodiment of the invention. When memory 14 is in test mode, sequence 70 can be used to load codes into memory 14 during the programming phase. In particular, in one embodiment, test modes, test patterns and test addresses may be programmed in this phase.

Referring to FIG. 8, waveforms 72, 74, and 76 are given for the SET signal, the LOAD signal, and a TDQ signal. One or more TDQ signals may be used to read and write test data, set test mode codes, load row and column addresses, program least significant bits (LSB) for row and column counters, and load test data patterns. In one embodiment, there can be eight TDQ signals: TDQ[0:7]. As the exemplary waveforms in FIG. 8 illustrate, the programming for testing memory 14 can be performed asynchronously (i.e., without a clock signal). The SET and LOAD signals are used to input codes for setting test modes and enable test address or vectors to be loaded. These codes may be provided in the one or more TDQ signals. The codes can indicate or represent, for example, any of the following: no test, load row address mode, reserve, load column address mode, set row counter LSB, set/load test data background equations, all even row enable, all odd row enable, disable all pumps and regulators, disable redundant rows and columns, set column counter LSB, start test counter, load data pattern, set row counter count down, set column counter count down, and individual DQ access mode.

For example, in one embodiment, to load an initial burst column address (i.e., the starting address in a column burst counter), the following command is issued using the timing shown in FIG. 8:

SET=1 with TDQ[7:0]=00000011→this sets the "Load Column Address" bit active (e.g., LCA=1).

LOAD=1 with TDQ[7:0]="start address"→load value at TDQs to the column address counter.

For setting just a test mode (e.g., disabling a voltage regulator, setting access phase (i.e., TCNT=1), or setting 8X parallel test modes), then the SET signal in combination with valid TDQs is sufficient. In one embodiment, test modes can be persistent or non-persistent. Test modes that are non-persistent go away once a new code is programmed. Test modes that are persistent will remain in effect even after a new code is programmed.

Bonding Pad Layout

FIGS. 9A–9D are diagrams of exemplary bonding pad layouts 100, 200, 300, and 400, according to embodiments of the invention. These layouts 100, 200, 300, and 400 can be the physical and/or logical layouts for the bonding pads of a memory 14 so that various signals may be input into or output from the memory 14.

According to embodiments of the present invention, full testing of a memory 14 can be accomplished with bonding pads which are duplicative of all or a reduced set of the bonding pads typically used for control signals, and a number of bonding pads for the specialized signals described herein. The bonding pads which can be duplicative may receive, for example, test memory clock (TCLK), test clock enable (TCKE), test chip select (TCS), test row address strobe (TRAS), test column address strobe (TCAS), and test write enable (TWE) signals, which are test signals corresponding to the normal control signals memory clock (CLK), clock enable (CKE), chip select (CS), row address strobe (RAS), column address strobe (CAS), and write enable (WE). As depicted in FIGS. 9A–9D, the bonding pads for specialized signals may receive the test (TEST), set (SET), load (LOAD), reset (RESET), test stop row (TSR) counter, test stop column (TSC) counter, and test data (TDQ[0:7]) signals, as well as analog, external word-line voltage (XVCCP), memory substrate voltage (XVBB), and cell plate voltage (XDVC2) signals.

As described above, memory 14, according to embodiments of the present invention, is designed to be combined in the same package as another die (e.g., system IC 12) with a "footprint" or pin-out that is very similar or the same as that for the other die when packaged on its own. Thus, the same I/O pins or external terminals 20 would need to support all aspects of operation and testing for both the other die and memory 14; few, if any, I/O pins would be dedicated or provided for memory 14 to communicate with external circuitry.

Further, as described herein, memory 14 may operate in at least two separate modes: normal operation and test mode. In normal operation, memory 14 sends and receives normal control and data signals (e.g., CLK, CKE, CS, RAS, CAS, WE, and DQ[0:n]) to and from the other die (e.g., system IC 12) via the corresponding bonding pads. In test mode, memory 14 communicates the specialized signals to and from external circuits (e.g., external test equipment) via appropriate bonding pads. These signals may include TEST, SET, LOAD, RESET, TCLK, TCKE, TCS, TRAS, TCAS, TWE, TSR counter, TSC counter, TDQ[0:7], XVCCP, XVBB, and XDVC2 signals.

In test mode, there may be two phases: a programming phase and an access phase. In the programming phase, the memory 14 can be programmed or loaded with test addresses and sequential test data patterns (or codes) for testing. In the access phase, the memory 14 is actually operated using the test addresses and test patterns. In general, with some embodiments, programming of memory 14 during testing can be asynchronous. In other embodiments or as an option, programming can be synchronous for memory 14. Also, during access phase, the memory 14 may operate synchronously or asynchronously, depending on the memory specification.

The TEST, SET, LOAD, and TDQ[0:n] signals may be used throughout the testing (or test mode) of memory 14, where n can be any suitable number (e.g., 1, 2, 4, 8, 16, etc.) for TDQ signals. In some embodiments, the TEST signal is made a high value (or "1", such as VDD) and remains high throughout in-package testing. The SET and LOAD signals are initially at a low value (or "0", such as GND), but are pulsed high for predetermined periods during the test mode. For example, in one embodiment, to set the test mode, the SET signal is made a high value, while the LOAD signal remains low. Then during the programming phase, the LOAD signal is made a high value, while the SET signal remains low, to load one or more test registers with test addresses and sequential test data patterns (or codes) using the TDQ signals. For example, the TDQ signals can be used to load row addressees, load column addresses, set row counter least significant bit (LSB), set column counter LSB, set row counter count down, set column counter count down, and start test counter, as described in more detail in related U.S. application Ser. No. 10/205,883 entitled "Internally Generating Patterns For Testing In An Integrated Circuit Device," filed on Jul. 25, 2002, assigned to the same assignee and incorporated by reference herein in its entirety. In the access phase, both the LOAD and the SET signals are made high to enable data to be input into memory 14 via the TDQ signals and to enable the memory to be controlled by the test control signals (e.g., TCLK, TCKE, TCS, TRAS, TCAS, TWE, TSR counter, and TSC counter). The memory 14 only recognizes the addresses from the programmed row and column test counters, and the TDQ signals are used to read and write data to memory 14. Although eight TDQ signals may be used in some embodiments, in other embodiments fewer than eight TDQ signals are used. Thus, with some embodiments of the present invention, eleven or less signals (i.e., SET, TEST, LOAD, and up to eight TDQ signals), and corresponding bonding pads for the same, can be provided for full testing of memory 14 when it is combined with another chip in the same package.

In some embodiments, all of the signals input/output at the bonding pads for testing of memory 14 can be multiplexed with signals sent to or received from system IC 12 for normal operation, except for the TEST signal; thus, an external lead or pin may be dedicated for the TEST signal. In other embodiments, the TEST signal can be driven through system IC 12 to memory 14; and thus, no dedicated external lead or pin is necessary. The multiplexing of signals for testing and signals for normal operation can be accomplished with test buffer multiplexer circuits 22. As described herein, these test buffer multiplexer circuits 22 enable full access to memory 14 by multiplexing between signals from system IC 12 in normal operation (appearing at one group of bonding pads) and signals from external test equipment during testing (appearing at another group of bonding pads). Embodiments of the present invention may also utilize or incorporate the input/output buffers and test buffers, which are described in U.S. application Ser. No. 09/666,208 entitled "Chip Testing Within a Multi-Chip Semiconductor Package," filed on Sep. 21, 2000, assigned to the same assignee and incorporated by reference herein in its entirety.

FIG. 9A is a diagram of exemplary bonding pad layout 100, according to an embodiment of the invention. In bonding pad layout 100, a plurality of bonding pads are physically located on all (four) sides of a semiconductor die. Of these bonding pads, a portion are primarily provided for testing of a memory 14. As depicted, these bonding pads include TEST, TLOAD (or LOAD), TSET (or SET), TRST (or RESET), TDQ[0:7], VCCP, VBB, VDDA, DVC2, bond option (OPTS0 and OPTS1), test data mask low (DQML_T), test data mask high (DQM_T), WE_T (or TWE), TAP (AP_T), RAS_T (or TRAS), CAS_T (or TCAS), CS_T (or TCS), CKE_T (or TCKE), and TBA (BA_T). The bonding pads for testing are located on two opposing sides of the semiconductor die.

FIG. 9B is a diagram of another exemplary bonding pad layout 200, according to an embodiment of the invention. In bonding pad layout 100, a plurality of bonding pads are physically located in two rows along one side of a semiconductor die. As depicted, the bonding pads which are primarily provided for testing of a memory 14 include TEST, LOAD, SET, RESET, TDQ[0:7], XVBB, XVDDA, XDVC2, TWE[0:3], TRASA, TRASB, and TCAS.

In the exemplary bonding pad layout 200, some of the pads are provided for bonding memory 14 with another die (e.g., system IC 12). These pads include, for example, RASA, RASB, CAS, WE[0:3], output enable (OE), A[0:11], DQ[0:31], partial refresh (PREF), delayed CAS (DCAS), and TEST. Also, signals for at least a portion of the bonding pads can be multiplexed with signals for other bonding pads; these pads include SET, LOAD, RESET, TRASA, TRASB, TCAS, TWE[0:3], TOE, TBCA, TDQ[0:7], XVCCP, XVBB, XVDDA, and XDVC2.

FIG. 9C is a diagram of yet another exemplary bonding pad layout 300, according to an embodiment of the invention. In bonding pad layout 300, a plurality of bonding pads are physically located in one row along one side of a semiconductor die. As depicted, the bonding pads which are primarily provided for testing of a memory 14 include TEST, LOAD, SET, RESET, TD[0:7] (or TDQ[0:7]), VCCP, VBB, DVC2, TWE, TRAS, TCAS, TSC, TSR, TREDA[0:1], TCLK, and TCKE. The layout 300 is advantageous in that another die can be stacked on memory 14 in a way that covers three of the sides, while still leaving access to the bonding pads which are located on just the one side of memory 14.

In this embodiment, as shown, memory 14 may include at least two test chip select (TCS) bonding pads. The first TCS bonding pad may used to receive a test chip select signal which will select memory 14 for testing. The second TCS bonding pad can be a "dummy" bonding pad which is used as a landing pad for bonding the test chip select signal of another die (e.g., a second memory 14) that is stacked on top of the depicted memory 14.

For example, when the dies for two memories 14 are stacked with an offset which leaves the bonding pads on the lower die exposed for bonding, the second TCS bonding pad on the lower memory 14 can be used as a landing pad for the test chip select signal that selects the upper memory 14; the second TCS bonding pad of the lower memory 14 is connected or bonded to the first TCS bonding pad of the upper memory 14. In general, due to the possibility of inadvertently shorting the test chip select signal that selects the lower memory 14 when it is stacked beneath the upper memory 14, it may be undesirable to provide a direct connection between the pin or lead for the test chip select signal that selects the upper memory 14 and the first TCS bonding pad on the upper memory. In some embodiments, the second TCS or dummy bonding pad on the die for a memory 14 is completely isolated (e.g., not connected) to any circuitry in the memory 14. In other embodiments, the second TCS bonding pad may be connected to a electrostatic discharge (ESD) structure. ESD structures are used to prevent electrostatic discharge from damaging a chip. For the remainder of the bonding pads on the two memory chips 14 which are stacked in offset manner, each bonding pad on the lower chip may be connected by bonding wire to the corresponding bonding pad on the upper chip.

FIG. 9D is a diagram of still yet another exemplary bonding pad layout 400, according to an embodiment of the invention. In bonding pad layout 400, a plurality of bonding pads are physically located in two rows along one side of a semiconductor die and one row along an opposing side of the die. As depicted, the bonding pads which are primarily provided for testing of a memory 14 include TEST, LOAD, SET, TDQ[0:7], VCCP, VBB, VDDA, DVC2, TWE, TRAS, TCAS, TSC, TSR, TCS, TCKE, TCLK. These bonding pads for testing are located on just one side of the die.

FIG. 9E is a diagram of another exemplary bonding pad layout 500, according to an embodiment of the invention. In bonding pad layout 500, a plurality of bonding pads are physically located in two rows along one side of a semiconductor die and one row along an opposing side of the die.

In some embodiments, at least a portion of the signaling for the semiconductor die can be routed from one part of the die to another part via bonding wires, rather than connections which are internal or integral to the die. For this purpose, as depicted, some of the bonding pads in layout 500 on the first side of the semiconductor die are provided for receiving the same signaling as some of the bonding pads on the second side of the semiconductor die. For example, these bonding pads include ones for VDDQ, VDD, GND, AN[0:3], VB0, VB1, VTST, TDQ[0:7], TCS, TCS-D, TCKE, TCLK, TRAS, TCAS, TWE, TEST, SET/VS, and LOAD. The bonding pads on the first side may be connected to the corresponding bonding pads on the second side with bonding wires. This eliminates or reduces the need for internal routing connections within the die, thereby providing a savings in implementation space.

Also, with bonding pad layout 500, bonding pads are provided for test chip select (TCS) and test chip select dummy (TCS-D). As described above with reference to FIG. 9C, the TCS bonding pad may used to receive a test chip select signal which will select memory 14 for testing. The TCS-D bonding pad can be a "dummy" bonding pad which is used as a landing pad for bonding the test chip select signal of another die (e.g., a second memory 14) that can be stacked on top of the depicted memory 14.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A system for testing a first integrated circuit chip to be packaged along with at least a second integrated circuit chip in a semiconductor device, wherein at least some external terminals for the semiconductor device are to be shared by the first and second integrated circuit chips, wherein the first integrated circuit chip is designed for normal operation and a test mode, the system comprising on the first integrated circuit chip:

a first bonding pad for a SET signal;
   a second bonding pad for a LOAD signal;
   a third bonding pad for a TEST signal; and
   a plurality of bonding pads for TDQ signals;
   wherein the SET, LOAD, and TEST signals are used to transition the first integrated circuit chip from normal operation into the test mode and to enable test codes to be loaded into the first integrated circuit during a programming phase of the test mode;
   wherein the TDQ signals are used to load test codes into the first integrated circuit during the programming phase and to read/write data to and from the first integrated circuit during an access phase of the test mode.

2. The system of claim 1 wherein in the access phase, the first integrated circuit chip is operated to test for functionality.

3. The system of claim 1 wherein in the access phase, the first integrated circuit chip is further operated to test for ability to withstand stresses.

4. The system of claim 1 wherein the first integrated circuit chip comprises a memory device.

5. The system of claim 1 wherein the first integrated circuit chip comprises a logic device.

6. The system of claim 1 wherein the first integrated circuit chip comprises a plurality of test input control buffer circuits, each test input control buffer circuit operable to receive at least one of the TDQ signals for loading test codes into the first integrated circuit chip during the programming phase; and wherein the SET, LOAD, and TEST signals control the test input control buffer circuits.

7. The system of claim 1 wherein the SET signal is used to set a test code and a LOAD signal is used to load the test code during the programming phase.

8. The system of claim 1 wherein the first, second, and third bonding pads for the SET, LOAD, and TEST signals and the plurality of bonding pads for corresponding TDQ signals are implemented on the first integrated circuit chip; and wherein at least a portion of the SET, LOAD, TEST, and TDQ signals can be multiplexed with signals at other bonding pads of the first integrated circuit chip.

9. The system of claim 1 wherein the first, second, and third bonding pads for the SET, LOAD, and TEST signals and the plurality of bonding pads for corresponding TDQ signals are operable to be connected to external testing circuitry.

10. A memory chip for packaging along with at least a system chip in a semiconductor device, wherein at least some external terminals for the semiconductor device are to be shared by the memory chip and the system chip, wherein the memory chip is designed for normal operation and a test mode, the memory chip comprising:
   a first group of bonding pads for communicating TEST, SET, and LOAD signals operable to transition the memory chip from normal operation into the test mode and to enable test codes to be loaded into the memory chip during a programming phase of the test mode; and
   a second group of bonding pads for communicating a plurality of TDQ signals operable to load test codes into the memory chip during the programming phase and to read/write data to and from the memory chip during an access phase of the test mode.

11. The memory chip of claim 10 comprising a third group of bonding pads for communicating a plurality of test control signals operable to control the memory chip during the access phase of the test mode.

12. The memory chip of claim 11 wherein each test control signal corresponds to a respective control signal that is used to control the memory chip during the normal operation.

13. The memory chip of claim 11 wherein each of the test control signals is multiplexed with the respective control signal.

14. The memory chip of claim 11 wherein the test control signals comprise test write enable (TWE), test row address strobe (TRAS), and test column address strobe (TCAS) signals.

15. The memory chip of claim 10 wherein in the access phase, the memory chip is operated to test for functionality.

16. The memory chip of claim 10 wherein in the access phase, the memory chip is operated to test for ability to withstand stresses.

17. The memory chip of claim 10 comprising a plurality of test input control buffer circuits, each test input control buffer circuit operable to receive at least one of the TDQ signals for loading test codes into the memory chip during the programming phase, and wherein the SET, LOAD, and TEST signals control the test input control buffer circuits.

18. A first integrated circuit chip for packaging along with at least a second integrated circuit chip in a semiconductor device, wherein at least some external terminals for the semiconductor device are to be shared by the first and the second integrated circuit chips, wherein the first integrated circuit chip is designed for normal operation and a test mode, the first integrated circuit chip comprising up to eleven bonding pads for complete testing of the first integrated circuit chip, wherein the up to eleven bonding pads are for communicating TEST, SET, LOAD, and a plurality of TDQ signals, wherein the TEST, SET, and LOAD signals are operable to transition the first integrated circuit chip from normal operation into the test mode and to enable test codes to be loaded into the first integrated circuit chip during a programming phase of the test mode, and wherein the plurality of TDQ signals are operable to load test codes into the first integrated circuit during the programming phase of the test mode and to read/write data to and from the first integrated circuit chip during an access phase of the test mode.

19. The first integrated circuit chip of claim 18 wherein at least a portion of the SET, LOAD, TEST, and the plurality of TDQ signals can be multiplexed with signals at other bonding pads of the first integrated circuit chip.

20. The first integrated circuit chip of claim 18 wherein the bonding pads for complete testing of the first integrated circuit chip are operable to be connected to external testing circuitry.

21. The first integrated circuit chip of claim 18 wherein in the access, phase the first integrated circuit chip is operated to test for functionality.

22. The first integrated circuit chip of claim 18 wherein the loading of test codes into the first integrated circuit chip is performed asynchronously.

23. A system for testing a first integrated circuit chip to be packaged along with at least a second integrated circuit chip in a semiconductor device, wherein at least some external terminals for the semiconductor device are to be shared by the first and second integrated circuit chips, wherein the first integrated circuit chip is designed for normal operation and a test mode, the system comprising up to eight bonding pads on the first integrated circuit chip for receiving corresponding TDQ signals, wherein the TDQ signals are used to load test codes into the first integrated circuit during a programming phase of the test mode and to read/write data to and from the first integrated circuit during an access phase of the test mode.

24. The system of claim 23 wherein in the access phase, the first integrated circuit chip is operated to test for functionality.

25. The system of claim 23 wherein in the access phase, the first integrated circuit chip is further operated to test for ability to withstand stresses.

26. The system of claim 23 wherein the first integrated circuit chip comprises a memory device.

27. The system of claim 23 wherein the first integrated circuit chip comprises a logic device.

28. The system of claim 23 wherein the first integrated circuit chip comprises a plurality of test input control buffer circuits, each test input control buffer circuit operable to receive at least one of the TDQ signals for loading test codes into the first integrated circuit chip during the programming phase.

* * * * *